United States Patent
Acar et al.

(10) Patent No.: US 9,352,961 B2
(45) Date of Patent: *May 31, 2016

(54) FLEXURE BEARING TO REDUCE QUADRATURE FOR RESONATING MICROMACHINED DEVICES

(75) Inventors: Cenk Acar, Newport Coast, CA (US); John Gardner Bloomsburgh, Oakland, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 380 days.

This patent is subject to a terminal disclaimer.

(21) Appl. No.: 13/813,443

(22) PCT Filed: Sep. 16, 2011

(86) PCT No.: PCT/US2011/052006
§ 371 (c)(1),
(2), (4) Date: May 7, 2013

(87) PCT Pub. No.: WO2012/037501
PCT Pub. Date: Mar. 22, 2012

(65) Prior Publication Data
US 2013/0298671 A1    Nov. 14, 2013

Related U.S. Application Data

(60) Provisional application No. 61/384,247, filed on Sep. 18, 2010, provisional application No. 61/384,512, filed on Sep. 20, 2010.

(51) Int. Cl.
*G01C 19/56* (2012.01)
*G01C 19/5712* (2012.01)
*B81C 1/00* (2006.01)

(52) U.S. Cl.
CPC ............ *B81C 1/00523* (2013.01); *G01C 19/56* (2013.01); *G01C 19/5712* (2013.01)

(58) Field of Classification Search
CPC . G01C 19/5712; G01C 19/56; G01C 19/5733
USPC ............... 73/504.12, 504.04, 504.14, 504.02
See application file for complete search history.

(56) References Cited

U.S. PATENT DOCUMENTS

3,231,729 A    1/1966   Stern
4,896,156 A    1/1990   Garverick
(Continued)

FOREIGN PATENT DOCUMENTS

CN    1068444 A    1/1993
CN    1198587 A    11/1998
(Continued)

OTHER PUBLICATIONS

"U.S. Appl. No. 13/363,537, Final Office Action mailed Jun. 27, 2014", 8 pgs.
(Continued)

*Primary Examiner* — Helen Kwok
(74) *Attorney, Agent, or Firm* — Schwegman Lundberg & Woessner, P.A.

(57) ABSTRACT

An example include microelectromechanical die for sensing motion that includes a fixed portion, an anchor coupled to the fixed portion, a first nonlinear suspension member coupled to anchor on a side of the anchor, a second nonlinear suspension member coupled to the anchor on the same side of the anchor, the second nonlinear suspension member having a shape and location mirroring the first nonlinear suspension member about an anchor bisecting plane and a proof-mass that is planar, the proof mass suspended at least in part by the first nonlinear suspension member and the second nonlinear suspension member such that the proof-mass is rotable about the anchor and is slideable in a plane parallel to the fixed portion.

15 Claims, 20 Drawing Sheets

(56) References Cited

U.S. PATENT DOCUMENTS

| | | | |
|---|---|---|---|
| 5,481,914 A | 1/1996 | Ward | |
| 5,487,305 A | 1/1996 | Ristic et al. | |
| 5,491,604 A | 2/1996 | Nguyen et al. | |
| 5,600,064 A | 2/1997 | Ward | |
| 5,656,778 A | 8/1997 | Roszhart | |
| 5,703,292 A | 12/1997 | Ward | |
| 5,723,790 A | 3/1998 | Andersson | |
| 5,751,154 A | 5/1998 | Tsugai | |
| 5,760,465 A | 6/1998 | Alcoe et al. | |
| 5,765,046 A | 6/1998 | Watanabe et al. | |
| 5,894,091 A | 4/1999 | Kubota | |
| 5,912,499 A | 6/1999 | Diem et al. | |
| 6,131,457 A | 10/2000 | Sato | |
| 6,214,644 B1 | 4/2001 | Glenn | |
| 6,236,096 B1 | 5/2001 | Chang et al. | |
| 6,250,157 B1 | 6/2001 | Touge | |
| 6,253,612 B1 | 7/2001 | Lemkin et al. | |
| 6,301,965 B1 | 10/2001 | Chu et al. | |
| 6,351,996 B1 | 3/2002 | Nasiri et al. | |
| 6,366,468 B1 | 4/2002 | Pan | |
| 6,390,905 B1 | 5/2002 | Korovin et al. | |
| 6,501,282 B1 | 12/2002 | Dummermuth et al. | |
| 6,504,385 B2 | 1/2003 | Hartwell | |
| 6,553,835 B1 | 4/2003 | Hobbs et al. | |
| 6,654,424 B1 | 11/2003 | Thomae et al. | |
| 6,664,941 B2 | 12/2003 | Itakura et al. | |
| 6,722,206 B2 | 4/2004 | Takada | |
| 6,725,719 B2 | 4/2004 | Cardarelli | |
| 6,737,742 B2 | 5/2004 | Sweterlitsch | |
| 6,781,231 B2 | 8/2004 | Minervini et al. | |
| 6,848,304 B2 | 2/2005 | Geen | |
| 7,051,590 B1 | 5/2006 | Lemkin et al. | |
| 7,054,778 B2 | 5/2006 | Geiger et al. | |
| 7,093,487 B2 | 8/2006 | Mochida | |
| 7,166,910 B2 | 1/2007 | Minervini et al. | |
| 7,173,402 B2 | 2/2007 | Chen et al. | |
| 7,202,552 B2 | 4/2007 | Zhe et al. | |
| 7,210,351 B2 | 5/2007 | Lo et al. | |
| 7,221,767 B2 | 5/2007 | Mullenborn et al. | |
| 7,240,552 B2 | 7/2007 | Acar et al. | |
| 7,258,011 B2 | 8/2007 | Nasiri et al. | |
| 7,258,012 B2 | 8/2007 | Xie et al. | |
| 7,266,349 B2 | 9/2007 | Kappes | |
| 7,293,460 B2 | 11/2007 | Zarabadi et al. | |
| 7,301,212 B1 | 11/2007 | Mian et al. | |
| 7,305,880 B2 | 12/2007 | Caminada et al. | |
| 7,339,384 B2 | 3/2008 | Peng et al. | |
| 7,358,151 B2 | 4/2008 | Araki et al. | |
| 7,436,054 B2 | 10/2008 | Zhe | |
| 7,449,355 B2 | 11/2008 | Lutz et al. | |
| 7,451,647 B2 | 11/2008 | Matsuhisa et al. | |
| 7,454,967 B2 | 11/2008 | Skurnik | |
| 7,518,493 B2 | 4/2009 | Bryzek et al. | |
| 7,539,003 B2 | 5/2009 | Ray et al. | |
| 7,544,531 B1 | 6/2009 | Grosjean | |
| 7,595,648 B2 | 9/2009 | Ungaretti et al. | |
| 7,600,428 B2 | 10/2009 | Robert et al. | |
| 7,616,078 B2 | 11/2009 | Prandi et al. | |
| 7,622,782 B2 | 11/2009 | Chu et al. | |
| 7,694,563 B2 | 4/2010 | Durante et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,817,331 B2 | 10/2010 | Moidu | |
| 7,851,925 B2 | 12/2010 | Theuss et al. | |
| 7,859,352 B2 | 12/2010 | Sutton | |
| 7,950,281 B2 | 5/2011 | Hammerschmidt | |
| 7,965,067 B2 | 6/2011 | Grönthal et al. | |
| 8,004,354 B1 | 8/2011 | Pu et al. | |
| 8,006,557 B2 | 8/2011 | Yin et al. | |
| 8,026,771 B2 | 9/2011 | Kanai et al. | |
| 8,037,755 B2 | 10/2011 | Nagata et al. | |
| 8,113,050 B2 | 2/2012 | Acar et al. | |
| 8,171,792 B2 | 5/2012 | Sameshima | |
| 8,201,449 B2 | 6/2012 | Ohuchi et al. | |
| 8,250,921 B2 | 8/2012 | Nasiri et al. | |
| 8,256,290 B2 | 9/2012 | Mao | |
| 8,375,789 B2 | 2/2013 | Prandi et al. | |
| 8,378,756 B2 | 2/2013 | Huang et al. | |
| 8,421,168 B2 | 4/2013 | Allen et al. | |
| 8,476,970 B2 | 7/2013 | Mokhtar et al. | |
| 8,497,746 B2 | 7/2013 | Visconti et al. | |
| 8,508,290 B2 | 8/2013 | Elsayed et al. | |
| 8,643,382 B2 | 2/2014 | Steele et al. | |
| 8,710,599 B2 | 4/2014 | Marx et al. | |
| 8,739,626 B2 | 6/2014 | Acar | |
| 8,742,964 B2 | 6/2014 | Kleks et al. | |
| 8,754,694 B2 | 6/2014 | Opris et al. | |
| 8,763,459 B2 | 7/2014 | Brand et al. | |
| 8,813,564 B2* | 8/2014 | Acar | 73/504.12 |
| 8,978,475 B2* | 3/2015 | Acar | 73/514.32 |
| 9,003,882 B1 | 4/2015 | Ayazi et al. | |
| 9,006,846 B2* | 4/2015 | Bryzek et al. | 257/415 |
| 9,062,972 B2 | 6/2015 | Acar et al. | |
| 9,069,006 B2 | 6/2015 | Opris et al. | |
| 9,094,027 B2 | 7/2015 | Tao et al. | |
| 9,095,072 B2 | 7/2015 | Bryzek et al. | |
| 9,156,673 B2 | 10/2015 | Bryzek et al. | |
| 2002/0021059 A1 | 2/2002 | Knowles et al. | |
| 2002/0083757 A1 | 7/2002 | Geen | |
| 2002/0117728 A1 | 8/2002 | Brosnihan et al. | |
| 2002/0178831 A1 | 12/2002 | Takada | |
| 2002/0189352 A1 | 12/2002 | Reeds, III et al. | |
| 2002/0196445 A1 | 12/2002 | Mcclary et al. | |
| 2003/0033850 A1 | 2/2003 | Challoner et al. | |
| 2003/0038415 A1 | 2/2003 | Anderson et al. | |
| 2003/0061878 A1 | 4/2003 | Pinson | |
| 2003/0200807 A1 | 10/2003 | Hulsing, II | |
| 2003/0222337 A1 | 12/2003 | Stewart | |
| 2004/0051508 A1 | 3/2004 | Hamon et al. | |
| 2004/0085784 A1 | 5/2004 | Salama et al. | |
| 2004/0088127 A1 | 5/2004 | M'closkey et al. | |
| 2004/0119137 A1 | 6/2004 | Leonardi et al. | |
| 2004/0177689 A1 | 9/2004 | Cho et al. | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |
| 2005/0097957 A1 | 5/2005 | Mcneil et al. | |
| 2005/0139005 A1 | 6/2005 | Geen | |
| 2005/0189635 A1 | 9/2005 | Humpston et al. | |
| 2005/0274181 A1 | 12/2005 | Kutsuna et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0097331 A1 | 5/2006 | Hattori | |
| 2006/0112764 A1 | 6/2006 | Higuchi | |
| 2006/0137457 A1 | 6/2006 | Zdeblick | |
| 2006/0207328 A1 | 9/2006 | Zarabadi et al. | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1 | 11/2006 | Lutz et al. | |
| 2006/0283245 A1 | 12/2006 | Konno et al. | |
| 2007/0013052 A1 | 1/2007 | Zhe et al. | |
| 2007/0034005 A1 | 2/2007 | Acar et al. | |
| 2007/0040231 A1 | 2/2007 | Harney et al. | |
| 2007/0042606 A1 | 2/2007 | Wang et al. | |
| 2007/0047744 A1 | 3/2007 | Harney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0113653 A1 | 5/2007 | Nasiri et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0214883 A1 | 9/2007 | Durante et al. | |
| 2007/0220973 A1 | 9/2007 | Acar | |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0079120 A1 | 4/2008 | Foster et al. | |
| 2008/0079444 A1 | 4/2008 | Denison | |

(56) References Cited

U.S. PATENT DOCUMENTS

| | | |
|---|---|---|
| 2008/0081398 A1 | 4/2008 | Lee et al. |
| 2008/0083958 A1 | 4/2008 | Wei et al. |
| 2008/0083960 A1 | 4/2008 | Chen et al. |
| 2008/0092652 A1 | 4/2008 | Acar |
| 2008/0122439 A1 | 5/2008 | Burdick et al. |
| 2008/0157238 A1 | 7/2008 | Hsiao |
| 2008/0157301 A1 | 7/2008 | Ramakrishna et al. |
| 2008/0169811 A1 | 7/2008 | Viswanathan |
| 2008/0202237 A1 | 8/2008 | Hammerschmidt |
| 2008/0245148 A1 | 10/2008 | Fukumoto |
| 2008/0247585 A1 | 10/2008 | Leidl et al. |
| 2008/0251866 A1 | 10/2008 | Belt et al. |
| 2008/0290756 A1 | 11/2008 | Huang |
| 2008/0302559 A1 | 12/2008 | Leedy |
| 2008/0314147 A1 | 12/2008 | Nasiri et al. |
| 2009/0007661 A1 | 1/2009 | Nasiri et al. |
| 2009/0056443 A1 | 3/2009 | Netzer |
| 2009/0064780 A1 | 3/2009 | Coronato et al. |
| 2009/0064781 A1 | 3/2009 | Ayazi et al. |
| 2009/0072663 A1 | 3/2009 | Ayazi et al. |
| 2009/0114016 A1 | 5/2009 | Nasiri et al. |
| 2009/0140606 A1 | 6/2009 | Huang |
| 2009/0166827 A1 | 7/2009 | Foster et al. |
| 2009/0175477 A1 | 7/2009 | Suzuki et al. |
| 2009/0183570 A1 | 7/2009 | Acar et al. |
| 2009/0194829 A1 | 8/2009 | Chung et al. |
| 2009/0217757 A1 | 9/2009 | Nozawa |
| 2009/0263937 A1 | 10/2009 | Ramakrishna et al. |
| 2009/0266163 A1 | 10/2009 | Ohuchi et al. |
| 2009/0272189 A1 | 11/2009 | Acar et al. |
| 2010/0019393 A1 | 1/2010 | Hsieh et al. |
| 2010/0024548 A1 | 2/2010 | Cardarelli |
| 2010/0038733 A1 | 2/2010 | Minervini |
| 2010/0044853 A1 | 2/2010 | Dekker et al. |
| 2010/0052082 A1 | 3/2010 | Lee |
| 2010/0058864 A1 | 3/2010 | Hsu et al. |
| 2010/0072626 A1 | 3/2010 | Theuss et al. |
| 2010/0089154 A1 | 4/2010 | Ballas et al. |
| 2010/0122579 A1 | 5/2010 | Hsu et al. |
| 2010/0126269 A1 | 5/2010 | Coronato et al. |
| 2010/0155863 A1 | 6/2010 | Weekamp |
| 2010/0206074 A1 | 8/2010 | Yoshida et al. |
| 2010/0212425 A1 | 8/2010 | Hsu et al. |
| 2010/0224004 A1 | 9/2010 | Suminto et al. |
| 2010/0236327 A1 | 9/2010 | Mao et al. |
| 2010/0263445 A1 | 10/2010 | Hayner et al. |
| 2010/0294039 A1 | 11/2010 | Geen |
| 2011/0023605 A1 | 2/2011 | Tripoli et al. |
| 2011/0030473 A1 | 2/2011 | Acar |
| 2011/0030474 A1 | 2/2011 | Kuang et al. |
| 2011/0031565 A1 | 2/2011 | Marx et al. |
| 2011/0074389 A1 | 3/2011 | Knierim et al. |
| 2011/0094302 A1 | 4/2011 | Schofield et al. |
| 2011/0120221 A1 | 5/2011 | Yoda |
| 2011/0121413 A1 | 5/2011 | Allen et al. |
| 2011/0146403 A1 | 6/2011 | Rizzo Piazza Roncoroni et al. |
| 2011/0147859 A1 | 6/2011 | Tanaka et al. |
| 2011/0179868 A1 | 7/2011 | Kaino et al. |
| 2011/0201197 A1 | 8/2011 | Nilsson et al. |
| 2011/0234312 A1 | 9/2011 | Lachhwani et al. |
| 2011/0265564 A1 | 11/2011 | Acar et al. |
| 2011/0285445 A1 | 11/2011 | Huang et al. |
| 2011/0316048 A1 | 12/2011 | Ikeda et al. |
| 2012/0126349 A1 | 5/2012 | Horning et al. |
| 2012/0326248 A1 | 12/2012 | Daneman et al. |
| 2013/0098153 A1 | 4/2013 | Trusov et al. |
| 2013/0139591 A1 | 6/2013 | Acar |
| 2013/0139592 A1 | 6/2013 | Acar |
| 2013/0192364 A1 | 8/2013 | Acar |
| 2013/0192369 A1 | 8/2013 | Acar et al. |
| 2013/0199263 A1 | 8/2013 | Egretzberger et al. |
| 2013/0221457 A1 | 8/2013 | Conti et al. |
| 2013/0247666 A1 | 9/2013 | Acar |
| 2013/0247668 A1 | 9/2013 | Bryzek |
| 2013/0250532 A1 | 9/2013 | Bryzek et al. |
| 2013/0257487 A1 | 10/2013 | Opris et al. |
| 2013/0263641 A1 | 10/2013 | Opris et al. |
| 2013/0263665 A1 | 10/2013 | Opris et al. |
| 2013/0265070 A1 | 10/2013 | Kleks et al. |
| 2013/0265183 A1 | 10/2013 | Kleks et al. |
| 2013/0268227 A1 | 10/2013 | Opris et al. |
| 2013/0268228 A1 | 10/2013 | Opris et al. |
| 2013/0269413 A1 | 10/2013 | Tao et al. |
| 2013/0270657 A1 | 10/2013 | Acar et al. |
| 2013/0270660 A1 | 10/2013 | Bryzek et al. |
| 2013/0271228 A1 | 10/2013 | Tao et al. |
| 2013/0277772 A1 | 10/2013 | Bryzek et al. |
| 2013/0277773 A1 | 10/2013 | Bryzek et al. |
| 2013/0283911 A1 | 10/2013 | Ayazi et al. |
| 2013/0328139 A1 | 12/2013 | Acar |
| 2013/0341737 A1 | 12/2013 | Bryzek et al. |
| 2014/0070339 A1 | 3/2014 | Marx |
| 2014/0275857 A1 | 9/2014 | Toth et al. |
| 2015/0059473 A1 | 3/2015 | Jia |
| 2015/0114112 A1 | 4/2015 | Valzasina et al. |
| 2015/0185012 A1 | 7/2015 | Acar |

FOREIGN PATENT DOCUMENTS

| | | |
|---|---|---|
| CN | 1206110 A | 1/1999 |
| CN | 1221210 A | 6/1999 |
| CN | 1272622 A | 11/2000 |
| CN | 1389704 A | 1/2003 |
| CN | 1532524 A | 9/2004 |
| CN | 1595062 A | 3/2005 |
| CN | 1595063 A | 3/2005 |
| CN | 1603842 A | 4/2005 |
| CN | 1617334 A | 5/2005 |
| CN | 1659810 A | 8/2005 |
| CN | 1693181 A | 11/2005 |
| CN | 1813192 A | 8/2006 |
| CN | 1816747 A | 8/2006 |
| CN | 1818552 A | 8/2006 |
| CN | 1886669 A | 12/2006 |
| CN | 1905167 A | 1/2007 |
| CN | 1948906 A | 4/2007 |
| CN | 101038299 A | 9/2007 |
| CN | 101059530 A | 10/2007 |
| CN | 101067555 A | 11/2007 |
| CN | 101069099 A | 11/2007 |
| CN | 101171665 A | 4/2008 |
| CN | 101180516 A | 5/2008 |
| CN | 101217263 A | 7/2008 |
| CN | 101239697 A | 8/2008 |
| CN | 101257000 A | 9/2008 |
| CN | 101270988 A | 9/2008 |
| CN | 101316462 A | 12/2008 |
| CN | 101329446 A | 12/2008 |
| CN | 101426718 A | 5/2009 |
| CN | 101459866 A | 6/2009 |
| CN | 101519183 A | 9/2009 |
| CN | 101520327 A | 9/2009 |
| CN | 101561275 A | 10/2009 |
| CN | 101634662 A | 1/2010 |
| CN | 101638211 A | 2/2010 |
| CN | 101813480 A | 8/2010 |
| CN | 101839718 A | 9/2010 |
| CN | 101055180 A | 10/2010 |
| CN | 101858928 A | 10/2010 |
| CN | 101916754 A | 12/2010 |
| CN | 101922934 A | 12/2010 |
| CN | 201688848 U | 12/2010 |
| CN | 102109345 A | 6/2011 |
| CN | 102337541 A | 2/2012 |
| CN | 102364671 A | 2/2012 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |

(56) References Cited

FOREIGN PATENT DOCUMENTS

| | | |
|---|---|---|
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |
| CN | 103403495 A | 11/2013 |
| CN | 203275441 U | 11/2013 |
| CN | 203275442 U | 11/2013 |
| CN | 203301454 U | 11/2013 |
| CN | 203349832 U | 12/2013 |
| CN | 203349834 U | 12/2013 |
| CN | 103663344 A | 3/2014 |
| CN | 203683082 U | 7/2014 |
| CN | 203719664 U | 7/2014 |
| CN | 104094084 A | 10/2014 |
| CN | 104105945 A | 10/2014 |
| CN | 104220840 A | 12/2014 |
| CN | 104272062 A | 1/2015 |
| DE | 112011103124 T5 | 12/2013 |
| DE | 102013014881 A1 | 3/2014 |
| EP | 1055910 A1 | 11/2000 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2096759 A1 | 9/2009 |
| EP | 2259019 A1 | 12/2010 |
| EP | 2466257 A1 | 6/2012 |
| JP | 0989927 A | 4/1997 |
| JP | 09089927 A | 4/1997 |
| JP | 10239347 A | 9/1998 |
| JP | 1164002 A | 3/1999 |
| JP | 2000046560 A | 2/2000 |
| JP | 2005024310 A | 1/2005 |
| JP | 2005114394 A | 4/2005 |
| JP | 2005294462 A | 10/2005 |
| JP | 3882972 B2 | 2/2007 |
| JP | 2007024864 A | 2/2007 |
| JP | 2008294455 A | 12/2008 |
| JP | 2009075097 A | 4/2009 |
| JP | 2009186213 A | 8/2009 |
| JP | 2009192458 A | 8/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 102013011621 A | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-9311415 A1 | 6/1993 |
| WO | WO-9503534 A1 | 2/1995 |
| WO | WO-0107875 A1 | 2/2001 |
| WO | WO-0175455 A2 | 10/2001 |
| WO | WO-2008059757 A1 | 5/2008 |
| WO | WO-2008087578 A2 | 7/2008 |
| WO | WO-2009050578 A2 | 4/2009 |
| WO | WO-2009156485 A1 | 12/2009 |
| WO | WO-2011016859 A2 | 2/2011 |
| WO | WO-2011016859 A3 | 2/2011 |
| WO | WO-2011107542 A2 | 9/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"U.S. Appl. No. 13/742,942, Notice of Allowance mailed Jan. 28, 2014", 8 pgs.

"U.S. Appl. No. 13/755,841, Supplemental Notice of Allowability Jun. 27, 2014", 2 pgs.

"U.S. Appl. No. 13/821,589, Non Final Office Action mailed Jul. 9, 2014", 10 pgs.

"U.S. Appl. No. 13/821,589, Response to Restriction Requirement mailed Apr. 11, 2014", 6 pgs.

"U.S. Appl. No. 13/821,598, Restriction Requirement mailed Aug. 15, 2014", 11 pgs.

"U.S. Appl. No. 13/821,612, Non Final Office Action mailed Jul. 23, 2014", 8 pgs.

"U.S. Appl. No. 13/821,853, Non Final Office Action mailed Jul. 30, 2014", 10 pgs.

"U.S. Appl. No. 13/860,761, Non Final Office Action mailed Aug. 19, 2014", 13 pgs.

"Chinese Application Serial No. 2010800423190, Response filed Aug. 11, 2014 to Office Action mailed Mar. 26, 2014", w/English Claims, 11 pgs.

"Chinese Application Serial No. 201180054796.3, Response filed Jun. 30, 2014 to Office Action mailed Jan. 16, 2014", w/English Claims, 3 pgs.

"Chinese Application Serial No. 201180055029.4, Office Action mailed Jul. 2, 2014", w/English Translation, 5 pgs.

"Chinese Application Serial No. 201180055309.5, Response filed Aug. 13, 2014 to Office Action mailed Mar. 31, 2014", w/English Claims, 27 pgs.

"Chinese Application Serial No. 201380007588.7, Notification to Make Rectification mailed Aug. 18, 2014", 2 pgs.

"Chinese Application Serial No. 201380007615.0, Notification to Make Rectification mailed Aug. 18, 2014", 2 pgs.

"European Application Serial No. 10806751.3, Response filed Jul. 24, 2014 to Office Action mailed Jan. 24, 2014", 26 pgs.

"European Application Serial No. 11826068.6, Extended European Search Report mailed Jul. 24, 2014", 10 pgs.

"European Application Serial No. 13001719.7, Extended European Search Report mailed Jun. 24, 2014", 10 pgs.

"International Application Serial No. PCT/US2013/021411, International Preliminary Report on Patentability mailed Aug. 14, 2014", 7 pgs.

(56) References Cited

OTHER PUBLICATIONS

"International Application Serial No. PCT/US2013/023877, International Preliminary Report on Patentability mailed Aug. 14, 2014", 7 pgs.
"International Application Serial No. PCT/US2013/024138, International Preliminary Report on Patentability mailed Aug. 14, 2014", 6 pgs.
"International Application Serial No. PCT/US2013/024149, International Preliminary Report on Patentability mailed Aug. 14, 2014", 6 pgs.
Xia, Guo-Ming, et al., "Phase correction in digital self-oscillation drive circuit for improve silicon MEMS gyroscope bias stability", Solid-State and Integrated Circuit Technology (ICSICT), 2010 10th IEEE International Conference on, IEEE, (Nov. 1, 2010), 1416-1418.
"U.S. Appl. No. 13/362,955, Final Office Action mailed Nov. 19, 2014", 5 pgs.
"U.S. Appl. No. 13/362,955, Response filed Aug. 15, 2014 to Non Final Office Action mailed May 15, 2014", 13 pgs.
"U.S. Appl. No. 13/363,537, Examiner Interview Summary mailed Sep. 29, 2014", 3 pgs.
"U.S. Appl. No. 13/363,537, Notice of Allowance mailed Nov. 7, 2014", 5 pgs.
"U.S. Appl. No. 13/363,537, Response filed Sep. 29, 2014 to Final Office Action mailed Jun. 27, 2014", 9 pgs.
"U.S. Appl. No. 13/821,586, Response filed Nov. 24, 2014 to Restriction Requirement mailed Sep. 22, 2014", 6 pgs.
"U.S. Appl. No. 13/821,586, Restriction Requirement mailed Sep. 22, 2014", 4 pgs.
"U.S. Appl. No. 13/821,589, Response filed Nov. 10, 2014 to Non Final Office Action mailed Jul. 9, 2014", 15 pgs.
"U.S. Appl. No. 13/821,598, Non Final Office Action mailed Nov. 20, 2014", 9 pgs.
"U.S. Appl. No. 13/821,598, Response filed Oct. 15, 2014 to Restriction Requirement mailed Aug. 15, 2014", 8 pgs.
"U.S. Appl. No. 13/821,612, Response filed Oct. 23, 2014 to Non Final Office Action mailed Jul. 23, 2014", 6 pgs.
"Chinese Application Serial No. 201180054796.3, Office Action mailed Sep. 4, 2014", w/English Claims, 11 pgs.
"Chinese Application Serial No. 201180055029.4, Response filed Nov. 14, 2014 to Office Action mailed Jul. 2, 2014", w/English Claims, 23 pgs.
"Chinese Application Serial No. 201310118845.6, Office Action mailed Sep. 9, 2014", 8 pgs.
"Chinese Application Serial No. 201310119472.4, Office Action mailed Sep. 9, 2014", w/English Translation, 11 pgs.
"European Application Serial No. 11826043.9, Office Action mailed May 6, 2013", 2 pgs.
"European Application Serial No. 11826043.9, Response filed Nov. 4, 2013 to Office Action mailed May 6, 2013", 6 pgs.
"European Application Serial No. 11826067.8, Extended European Search Report mailed Oct. 6, 2014", 10 pgs.
"European Application Serial No. 11826070.2, Response filed Sep. 19, 2014 to Office Action mailed Mar. 12, 2014", 11 pgs.
"European Application Serial No. 11826071.0, Response filed Sep. 19, 2014 to Office Action mailed Mar. 12, 2014", 20 pgs.
"European Application Serial No. 11827347.3, Office Action mailed May 2, 2013", 6 pgs.
"European Application Serial No. 11827347.3, Response filed Oct. 30, 2013 to Office Action mailed May 2, 2013", 9 pgs.
"European Application Serial No. 11827384.6, Extended European Search Report mailed Nov. 12, 2014", 6 pgs.
"European Application Serial No. 13001695.9, European Search Report mailed Oct. 5, 2014", 6 pgs.
Dunn, C, et al., "Efficient linearisation of sigma-delta modulators using single-bit dither", Electronics Letters 31(12), (Jun. 1995), 941-942.
Kulah, Haluk, et al., "Noise Analysis and Characterization of a Sigma-Delta Capacitive Microaccelerometer", 12th International Conference on Solid State Sensors, Actuators and Microsystems, (2003), 95-98.

Sherry, Adrian, et al., "AN-609 Application Note: Chopping on Sigma-Delta ADCs", Analog Devices, [Online]. Retrieved from the Internet: <URL: http://www.analog.com/static/imported-files/application_notes/AN-609.pdf>, (2003), 4 pgs.
"U.S. Appl. No. 12/849,742, Notice of Allowance mailed Nov. 29, 2013", 7 pgs.
"U.S. Appl. No. 12/849,787, Notice of Allowance mailed Dec. 11, 2013", 9 pgs.
"U.S. Appl. No. 13/362,955, Response filed Feb. 17, 2013 to Restriction Requirement mailed Dec. 17, 2013", 9 pgs.
"U.S. Appl. No. 13/362,955, Restriction Requirement mailed Dec. 17, 2013", 6 pgs.
"U.S. Appl. No. 13/363,537, Non Final Office Action mailed Feb. 6, 2014", 10 pgs.
"U.S. Appl. No. 13/742,942, Notice of Allowance mailed Jan. 28, 2014", 9 pgs.
"U.S. Appl. No. 13/746,016, Notice of Allowance mailed Jan. 17, 2014", 10 pgs.
"U.S. Appl. No. 13/755,841, Restriction Requirement mailed Feb. 21, 2014", 6 pgs.
"Chinese Application Serial No. 201180053926.1, Office Action mailed Jan. 13, 2014", 7 pgs.
"Chinese Application Serial No. 201180054796.3, Office Action mailed Jan. 16, 2014", 8 pgs.
"Chinese Application Serial No. 201180055029.4, Office Action mailed Jan. 13, 2014", 7 pgs.
"Chinese Application Serial No. 201320172366.8, Office Action mailed Oct. 25, 2013", 8 pgs.
"Chinese Application Serial No. 201320172366.8, Response filed Dec. 24, 2013 to Office Action mailed Oct. 25, 2013", 11 pgs.
"Chinese Application Serial No. 201320565239.4, Office Action mailed Jan. 16, 2014", w/English Translation, 3 pgs.
"European Application Serial No. 10806751.3, Extended European Search Report mailed Jan. 7, 2014", 7 pgs.
"Korean Application Serial No. 10-2013-0109990, Amendment filed Dec. 10, 2013", 4 pgs.
"Korean Application Serial No. 10-2013-7009775, Office Action mailed Dec. 27, 2013", 8 pgs.
"Korean Application Serial No. 10-2013-7009775, Response filed Oct. 29, 2013 to Office Action mailed Sep. 17, 2013", w/English Claims, 23 pgs.
"Korean Application Serial No. 10-2013-7009777, Office Action mailed Jan. 27, 2014", 5 pgs.
"Korean Application Serial No. 10-2013-7009777, Response filed Nov. 5, 2013 to Office Action mailed Sep. 17, 2013", 11 pgs.
"Korean Application Serial No. 10-2013-7009788, Office Action mailed Dec. 27, 2013", w/English Translation, 10 pgs.
"Korean Application Serial No. 10-2013-7009788, Response filed Oct. 29, 2013 to Office Action mailed Aug. 29, 2013", w/English Claims, 22 pgs.
"U.S. Appl. No. 12/849,742, Response filed Sep. 30, 2013 to Non-Final Office Action mailed Mar. 28, 2013", 12 pgs.
"U.S. Appl. No. 12/849,787, Response filed Oct. 28, 2013 to Non Final Office Action mailed May 28, 2013", 12 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.

(56) References Cited

OTHER PUBLICATIONS

"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.
"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
Ferreira, Antoine, et al., "A Survey of Modeling and Control Techniques for Micro- and Nanoelectromechanical Systems", IEEE Transactions on Systems, Man and Cybernetics-Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf? . . . >, (Jan. 1, 2004), 123 pgs.
"U.S. Appl. No. 12/849,787, Non Final Office Action mailed May 28, 2013", 18 pgs.
"U.S. Appl. No. 12/947,543, Notice of Allowance mailed Dec. 17, 2012", 11 pgs.
"U.S. Appl. No. 13/821,598, Preliminary Amendment mailed Mar. 8, 2013", 7 pgs.
"U.S. Appl. No. 13/821,609, Preliminary Amendment mailed Mar. 8, 2013", 3 pgs.
"U.S. Appl. No. 13/821,619, Preliminary Amendment mailed Mar. 8, 2013", 3 pgs.
"Application Serial No. PCT/US2011/051994, International Republished Application mailed Jun. 7, 2012", 1 pg.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", 1 pg.
"International Application Serial No. PCT/US2011/051994, International Preliminary Report on Patentability mailed Mar. 28, 2013", 8 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012" , 3 pgs.
"International Application Serial No. PCT/US2011/052369, International Preliminary Report on Patentability mailed Apr. 4, 2013", 5 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024149, Written Opinion mailed", 4 pages.
"International Application Serial No. PCT/US2013/024149, International Search Report mailed", 7 pages.
"T4020 & T4030 MEMS Microphones for Consumer Electronics", Product Brief 2010, Edition Feb. 2010, 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEMS Vibratory Gyroscopes: Structural Approaches to Improve Robustness, Springer, (2009), 225-245.
Krishnamurthy, Rajesh, et al., "Drilling and Filling, but not in your Dentist's Chair a look at some recent history of multi-chip and through silicon via (TSV) technology", Chip Design Magazine, (Oct./Nov. 2008), 7 pgs.
"U.S. Appl. No. 12/849,742, Non Final Office Action mailed Mar. 28, 2013", 9 pgs.
"U.S. Appl. No. 12/849,742, Non Final Office Action mailed Aug. 23, 2012", 9 pgs.
"U.S. Appl. No. 12/849,742, Response filed Jan. 23, 2012 to Non Final Office Action mailed Aug. 23, 2012", 10 pgs.

(56) References Cited

OTHER PUBLICATIONS

"U.S. Appl. No. 12/849,787, Response filed Feb. 4, 2013 to Restriction Requirement mailed Oct. 4, 2012", 7 pgs.
"U.S. Appl. No. 12/849,787, Restriction Requirement mailed Oct. 4, 2012", 5 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,612, Preliminary Amendment mailed Mar. 8, 2013", 3 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Application Serial No. PCT/US2011/052006, International Republished Application mailed Jun. 7, 2012", 1 pg.
"Application Serial No. PCT/US2011/052417, International Republished Application mailed Jun. 7, 2012", 1 pg.
"International Application Serial No. PCT/US2010/002166, International Preliminary Report on Patentability mailed Feb. 16, 2012", 6 pgs.
"International Application Serial No. PCT/US2010/002166, International Search Report mailed Feb. 28, 2011", 3 pgs.
"International Application Serial No. PCT/US2010/002166, Written Opinion mailed Feb. 28, 2011", 4 pgs.
"International Application Serial No. PCT/US2011/051994, International Search Report mailed Apr. 16, 2012", 3 pgs.
"International Application Serial No. PCT/US2011/051994, Written Opinion mailed Apr. 16, 2012", 6 pgs.
"International Application Serial No. PCT/US2011/052006, International Preliminary Report on Patentability mailed Mar. 28, 2013", 7 pgs.
"International Application Serial No. PCT/US2011/052006, Search Report mailed Apr. 16, 2012", 3 pgs.
"International Application Serial No. PCT/US2011/052006, Written Opinion mailed Apr. 16, 2012", 5 pgs.
"International Application Serial No. PCT/US2011/052059, International Preliminary Report on Patentability mailed Jan. 22, 2013", 14 pgs.
"International Application Serial No. PCT/US2011/052059, Search Report mailed Apr. 20, 2012", 4 pgs.
"International Application Serial No. PCT/US2011/052059, Written Opinion mailed Apr. 2012", 7 pgs.
"International Application Serial No. PCT/US2011/052060, International Preliminary Report on Patentability mailed Jan. 22, 2013", 12 pgs.
"International Application Serial No. PCT/US2011/052060, International Search Report Apr. 20, 2012", 3 pgs.
"International Application Serial No. PCT/US2011/052060, Written Opinion mailed Apr. 20, 2012", 7 pgs.
"International Application Serial No. PCT/US2011/052061, International Preliminary Report on Patentability mailed Mar. 28, 2013", 6 pgs.
"International Application Serial No. PCT/US2011/052061, International Search Report mailed Apr. 10, 2012", 3 pgs.
"International Application Serial No. PCT/US2011/052061, Written Opinion mailed Apr. 10, 2012", 4 pgs.
"International Application Serial No. PCT/US2011/052064, International Preliminary Report on Patentability mailed Mar. 28, 2013", 5 pgs.
"International Application Serial No. PCT/US2011/052064, Search Report mailed Feb. 29, 2012", 3 pgs.
"International Application Serial No. PCT/US2011/052064, Written Opinion mailed Feb. 29, 2012", 3 pgs.
"International Application Serial No. PCT/US2011/052065, International Preliminary Report on Patentability mailed Mar. 28, 2013", 7 pgs.
"International Application Serial No. PCT/US2011/052065, International Search Report mailed Apr. 10, 2012", 3 pgs.
"International Application Serial No. PCT/US2011/052065, Written Opinion mailed Apr. 10, 2012", 5 pgs.
"International Application Serial No. PCT/US2011/052369, International Search Report mailed Apr. 24, 2012", 6 pgs.
"International Application Serial No. PCT/US2011/052369, Written Opinion mailed Apr. 24, 2012", 3 pgs.
"International Application Serial No. PCT/US2011/052417, International Preliminary Report on Patentability mailed Apr. 4, 2013", 6 pgs.
"International Application Serial No. PCT/US2011/052417, International Search Report mailed Apr. 23, 2012", 5 pgs.
"International Application Serial No. PCT/US2011/052417, Written Opinion mailed Apr. 23, 2012", 4 pgs.
Beyne, E, et al., "Through-silicon via and die stacking technologies for microsystems-integration", IEEE International Electron Devices Meeting, 2008. IEDM 2008., (Dec. 2008), 1-4.
Cabruja, Enric, et al., "Piezoresistive Accelerometers for MCM-Package-Part II", The Packaging Journal of Microelectromechanical Systems. vol. 14, No. 4, (Aug. 2005), 806-811.
Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176.html, (Dec. 21, 2007), 94 pgs.
Rimskog, Magnus, "Through Wafer Via Technology for MEMS and 3D Integration", 32nd IEEE/CPMT International Electronic Manufacturing Technology Symposium, 2007. IEMT '07., (2007), 286-289.
"U.S. Appl. No. 12/849,742, Supplemental Notice of Allowability mailed Mar. 17, 2014", 3 pgs.
"U.S. Appl. No. 12/849,742, Supplemental Notice of Allowability mailed May 5, 2014", 2 pgs.
"U.S. Appl. No. 12/849,787, Supplemental Notice of Allowability mailed Mar. 21, 2014", 3 pgs.
"U.S. Appl. No. 13/362,955, Non Final Office Action mailed Apr. 15, 2014", 9 pgs.
"U.S. Appl. No. 13/363,537, Response filed Jun. 6, 2014 to Non Final Office Action mailed Feb. 6, 2014", 11 pgs.
"U.S. Appl. No. 13/742,942, Supplemental Notice of Allowability mailed Apr. 10, 2014", 2 pgs.
"U.S. Appl. No. 13/755,841, Notice of Allowance mailed May 7, 2014", 8 pgs.
"U.S. Appl. No. 13/755,841, Preliminary Amendment filed Oct. 10, 2013", 10 pgs.
"U.S. Appl. No. 13/755,841, Response filed Apr. 21, 2014 to Restriction Requirement mailed Feb. 21, 2014", 7 pgs.
"U.S. Appl. No. 13/821,589, Restriction Requirement mailed Apr. 11, 2014", 10 pgs.
"Chinese Application Serial No. 2010800423190, Office Action mailed Mar. 26, 2014", 10 pgs.
"Chinese Application Serial No. 201180053926.1, Response filed Apr. 29, 2014 to Office Action mailed Jan. 13, 2014", w/English Claims, 10 pgs.
"Chinese Application Serial No. 201180055029.4, Response filed May 27, 2014 to Office Action mailed Jan. 13, 2014", w/English Claims, 29 pgs.
"Chinese Application Serial No. 201180055309.5, Office Action mailed Mar. 31, 2014", w/English Claims, 7 pgs.
"Chinese Application Serial No. 201320172366.8, Office Action mailed Jan. 30, 2014", w/English Claims, 3 pgs.
"Chinese Application Serial No. 201320172366.8, Response filed Mar. 18, 2014 to Office Action mailed Jan. 30, 2014", w/English Claims, 20 pgs.
"Chinese Application Serial No. 201320565239.4, Response filed Mar. 31, 2014 to Office Action mailed Jan. 16, 2014", w/English Claims, 38 pgs.
"European Application Serial No. 118260070.2, Office Action mailed Mar. 12, 2014", 1 pg.
"European Application Serial No. 11826070.2, Extended European Search Report mailed Feb. 21, 2014", 5 pgs.

(56) References Cited

OTHER PUBLICATIONS

"European Application Serial No. 11826071.0, Extended European Search Report mailed Feb. 20, 2014", 6 pgs.

"European Application Serial No. 11826071.0, Office Action mailed Mar. 12, 2014", 1 pg.

"European Application Serial No. 13001692.6, Response filed Apr. 1, 2014 to Extended European Search Report mailed Jul. 24, 2013", 19 pgs.

"European Application Serial No. 13001721.3, Response filed Apr. 7, 2014 to Extended European Search Report mailed Jul. 18, 2013", 25 pgs.

"Korean Application Serial No. 10-2013-7009777, Response filed Apr. 28, 2014", w/English Claims, 19 pgs.

"U.S. Appl. No. 13/362,955, Notice of Allowance mailed Feb. 25, 2015", 8 pgs.

"U.S. Appl. No. 13/362,955, Response filed Jan. 16, 2015 to Final Office Action mailed Nov. 19, 2014", 9 pgs.

"U.S. Appl. No. 13/363,537, Corrected Notice of Allowance mailed Jan. 28, 2015", 2 pgs.

"U.S. Appl. No. 13/742,994, Non Final Office Action mailed May 1, 2015", 20 pgs.

"U.S. Appl. No. 13/755,953, Non Final Office Action mailed May 14, 2015", 11 pgs.

"U.S. Appl. No. 13/755,953, Response filed May 4, 2015 to Restrictiion Requirement mailed Mar. 3, 2015", 7 pgs.

"U.S. Appl. No. 13/755,953, Restriction Requirement mailed Mar. 3, 2015", 6 pgs.

"U.S. Appl. No. 13/765,068, Notice of Allowance mailed May 7, 2015", 12 pgs.

"U.S. Appl. No. 13/821,586, Non Final Office Action mailed Jan. 15, 2015", 8 pgs.

"U.S. Appl. No. 13/821,586, Response filed May 15, 2015 to Non Final Office Action mailed Jan. 15, 2015", 12 pgs.

"U.S. Appl. No. 13/821,589, Final Office Action mailed Mar. 12, 2015", 13 pgs.

"U.S. Appl. No. 13/821,589, response filed May 12, 2015 to final office action mailed Mar. 12, 2015", 12 pgs.

"U.S. Appl. No. 13/821,598, Response filed Feb. 20, 2015 to Non Final Office Action mailed Nov. 20, 2014", 12 pgs.

"U.S. Appl. No. 13/821,609, Notice of Allowance mailed Mar. 23, 2015", 11 pgs.

"U.S. Appl. No. 13/821,609, Response filed Feb. 13, 2015 to Restriction Requirement mailed Dec. 15, 2014", 6 pgs.

"U.S. Appl. No. 13/821,609, Restriction Requirement mailed Dec. 15, 2014", 7 pgs.

"U.S. Appl. No. 13/821,612, Notice of Allowance mailed Dec. 10, 2014", 8 pgs.

"U.S. Appl. No. 13/821,842, Non Final Office Action mailed Mar. 18, 2015", 20 pgs.

"U.S. Appl. No. 13/821,853, Non Final Office Action mailed Feb. 18, 2015", 15 pgs.

"U.S. Appl. No. 13/821,853, Response filed May 18, 2015 to Non Final Office Action mailed Feb. 18, 2015", 12 pgs.

"U.S. Appl. No. 13/821,853, Response filed Dec. 1, 2014 to Non Final Office Action mailed Jul. 30, 2014", 10 pgs.

"U.S. Appl. No. 13/860,761, Advisory Action mailed Mar. 25, 2015", 3 pgs.

"U.S. Appl. No. 13/860,761, Final Office Action mailed Jan. 15, 2015", 14 pgs.

"U.S. Appl. No. 13/860,761, Notice of Allowance mailed Apr. 28, 2015", 8 pgs.

"U.S. Appl. No. 13/860,761, Response filed Mar. 16, 2015 to Final Office Action mailed Jan. 16, 2015", 12 pgs.

"U.S. Appl. No. 13/860,761, Response filed Apr. 16, 2015 to Advisory Action mailed Mar. 25, 2015", 11 pgs.

"U.S. Appl. No. 13/860,761, Response filed Dec. 19, 2014 to Non Final Office Action mailed Aug. 19, 2014", 12 pgs.

"U.S. Appl. No. 14/658,579, Prliminary Amendment filed Mar. 18, 2015", 8 pgs.

"Chinese Application Serial No. 201180054796.3, Office Action mailed Jan. 30, 2015", with English translation of claims, 5 pgs.

"Chinese Application Serial No. 201180054796.3, Response filed Nov. 19, 2014 to Office Action mailed Sep. 4, 2014", with English translation of claims, 7 pgs.

"Chinese Application Serial No. 201180054796.3, Response filed Apr. 14, 2015 to Office Action mailed Jan. 30, 2015", w/ English Claims, 30 pgs.

"Chinese Application Serial No. 201180055309.5, Office Action mailed Jan. 8, 2015", with English translation of claims, 5 pgs.

"Chinese Application Serial No. 201180055630.3, Office Action mailed Dec. 22, 2014", with English translation of claims, 10 pgs.

"Chinese Application Serial No. 201180055630.3, Response filed Apr. 20, 2015 to Office Action mailed Dec. 22, 2014", w/ English Claims, 10 pgs.

"Chinese Application Serial No. 201180055792.7, Office Action mailed Dec. 22, 2014", with English translation of claims, 10 pgs.

"Chinese Application Serial No. 201180055792.7, Response filed May 5, 2015 to Office Action mailed Dec. 22, 2014", w/ English Claims, 15 pgs.

"Chinese Application Serial No. 201180055794.6, Office Action mailed Dec. 17, 2014", with English translation of claims, 9 pgs.

"Chinese Application Serial No. 201180055794.6, Response filed May 4, 2015 to Office Action mailed Dec. 17, 2014", w/ English Claims, 15 pgs.

"Chinese Application Serial No. 201180055823.9, Office Action mailed Mar. 19, 2015", w/ English Claims, 8 pgs.

"Chinese Application Serial No. 201180055845.5, Office Action mailed Mar. 4, 2015", w/ English Claims, 8 pgs.

"Chinese Application Serial No. 2013101188456, Response filed Jan. 21, 2015", with English translation of claims, 16 pgs.

"Chinese Application Serial No. 201310119472.4, Response filed Jan. 21, 2015", with English translation of claims, 16 pgs.

"Chinese Application Serial No. 201310119730.9, Office Action mailed May 4, 2015", w/ English Claims, 8 pgs.

"Chinese Application Serial No. 201310127961.4, Office Action mailed May 6, 2015", w/ English Claims, 7 pgs.

"Chinese Application Serial No. 201380007588.7, Response filed Oct. 24, 2014", with English translation, 3 pgs.

"Chinese Application Serial No. 201380007615.0, Response filed Oct. 24, 2014", with English translation, 3 pgs.

"European Application Serial No. 11826067.8, Response filed Apr. 27, 2015 to Extended European Search Report mailed Oct. 6, 2014", 32 pgs.

"European Application Serial No. 11826068.6, Response filed Feb. 9, 2015", 30 pgs.

"European Application Serial No. 11826071.0, Examination Notification Art. 94(3) mailed Dec. 11, 2014", 4 pgs.

"European Application Serial No. 11826071.0, Response filed Apr. 13, 2015 to Examination Notification Art. 94(3) mailed Dec. 11, 2014", 5 pgs.

"European Application Serial No. 13001695.9, Extended European Search Report mailed Jan. 22, 2015", 8 pgs.

"European Application Serial No. 13001719.7, Response filed Jan. 21, 2015", 29 pgs.

"U.S. Appl. No. 13/742,942, Supplemental Notice of Allowability mailed Apr. 10, 2014", 3 pgs.

"U.S. Appl. No. 13/742,994, Response filed Jul. 31, 2015 to Non Final Office Action mailed May 1, 2015", 12 pgs.

"U.S. Appl. No. 13/755,953, Response filed Sep. 15, 2015 to Non Final Office Action mailed May 14, 2015", 10 pgs.

"U.S. Appl. No. 13/821,586, Notice of Allowance mailed Jun. 5, 2015", 6 pgs.

"U.S. Appl. No. 13/821,589, Final Office Action mailed Jul. 17, 2015", 14 pgs.

"U.S. Appl. No. 13/821,598, Non Final Office Action mailed Jul. 7, 2015", 9 pgs.

"U.S. Appl. No. 13/821,598, Response filed Oct. 7, 2015 to Non Final Office Action mailed Jul. 7, 2015", 10 pgs.

"U.S. Appl. No. 13/821,619, Ex Parte Quayle Action mailed Jul. 16, 2015", 8 pgs.

"U.S. Appl. No. 13/821,619, Non Final Office Action mailed Oct. 13, 2015", 11 pgs.

(56) References Cited

OTHER PUBLICATIONS

"U.S. Appl. No. 13/821,619, Response filed Sep. 16, 2015 to Ex Parte Quayle Action mailed Jul. 16, 2015", 11 pgs.
"U.S. Appl. No. 13/821,793, Non Final Office Action mailed Jul. 27, 2015", 14 pgs.
"U.S. Appl. No. 13/821,842, Examiner Interview Summary mailed Sep. 15, 2015", 3 pgs.
"U.S. Appl. No. 13/821,842, Notice of Allowance Received mailed Sep. 15, 2015", 13 pgs.
"U.S. Appl. No. 13/821,842, Response filed Jun. 18, 2015 Non Final Office Action mailed Mar. 18, 2015", 11 pgs.
"U.S. Appl. No. 13/821,842, Supplemental Notice of Allowability mailed Sep. 28, 2015", 2 pgs.
"U.S. Appl. No. 13/821,853, Final Office Action mailed Jun. 18, 2015", 7 pgs.
"U.S. Appl. No. 13/857,349, Non Final Office Action mailed Oct. 8, 2015", 10 pgs.
"U.S. Appl. No. 14/023,869, Non Final Office Action mailed Jun. 15, 2015", 15 pgs.
"U.S. Appl. No. 14/658,579, Non Final Office Action mailed Jul. 1, 2015", 9 pgs.
"U.S. Appl. No. 14/658,579, Response filed Oct. 1, 2015 to Non Final Office Action mailed Jul. 1, 2015", 11 pgs.
"Chinese Application Serial No. 201180044919.5, Office Action mailed Jun. 25, 2015", w/ English Translation, 8 pgs.
"Chinese Application Serial No. 201180054796.3, Office Action mailed Jun. 4, 2015", w/ English Translation, 7 pgs.
"Chinese Application Serial No. 201180055630.3, Office Action mailed Jul. 10, 2015", w/ English Claims, 8 pgs.
"Chinese Application Serial No. 201180055630.3, Response filed Sep. 25, 2015 to Office Action mailed Jul. 10, 2015", w/ English Claims, 14 pgs.
"Chinese Application Serial No. 201180055792.7, Office Action mailed Jul. 21, 2015", w/ English Translation, 5 pgs.
"Chinese Application Serial No. 201180055823.9, Response filed Aug. 3, 2015 to Office Action mailed Mar. 19, 2015", w/ English Translation, 14 pgs.
"Chinese Application Serial No. 201180055845.5, Office Action mailed Aug. 5, 2015", w/ English Translation, 5 pgs.
"Chinese Application Serial No. 201180055845.5, Response filed Jul. 13, 2015 to Office Action mailed Mar. 4, 2015", w/ English Translation, 17 pgs.
"Chinese Application Serial No. 201310115550.3, Office Action mailed May 22, 2015", w/ English Claims, 8 pgs.
"Chinese Application Serial No. 201310119806.8, Office Action mailed Jul. 3, 2015", w/ English Claims, 12 pgs.
"Chinese Application Serial No. 201310119986.X, Office Action mailed May 12, 2015", w/ English Claims, 14 pgs.
"Chinese Application Serial No. 201310127961.4, Response filed Sep. 2, 2015 to Office Action mailed May 6, 2015", w/ English Claims, 19 pgs.
"Chinese Application Serial No. 201310128046.7, Office Action mailed Jul. 23, 2015", w/ English Translation, 7 pgs.
"Chinese Application Serial No. 201310415336.X, Office Action mailed Jul. 3, 2015", w/ English Claims, 9 pgs.
"Chinese Application Serial No. 201380007588.7, Office Action mailed Jun. 10, 2015", w/ English Claims, 7 pgs.
"Chinese Application Serial No. 201380007615.0, Office Action mailed May 6, 2015", w/ English Claims, 7 pgs.
"European Application Serial No. 11826069.4, Extended European Search Report mailed Jul. 23, 2015", 8 pgs.
"European Application Serial No. 11827347.3, Extended European Search Report mailed Jul. 31, 2015", 6 pgs.
"European Application Serial No. 11827357.2, Extended European Search Report mailed Aug. 26, 2015", 4 pgs.
"European Application Serial No. 13001720.5, Extended European Search Report mailed Aug. 20, 2015", 7 pgs.

* cited by examiner

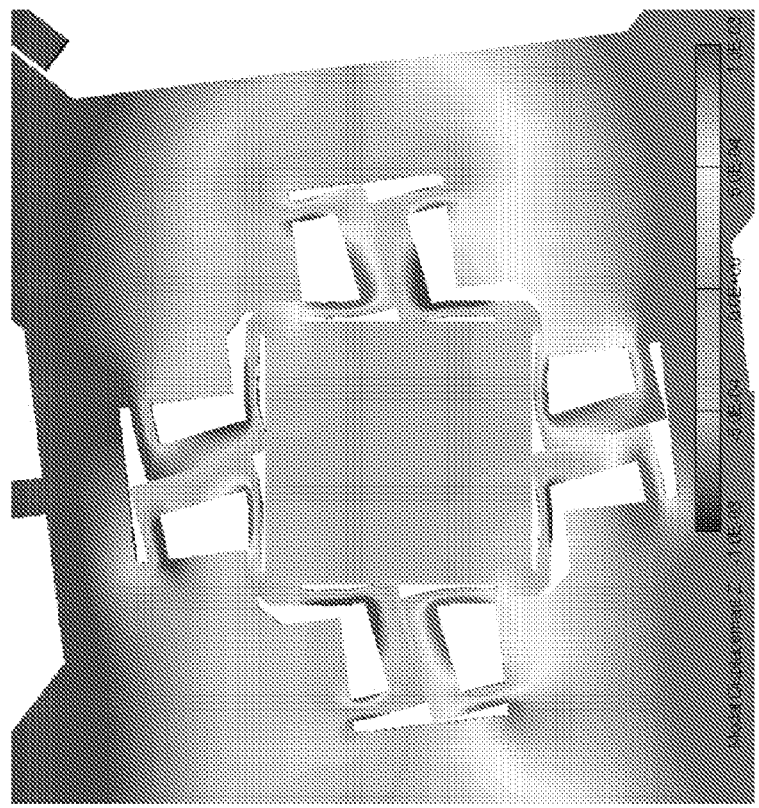
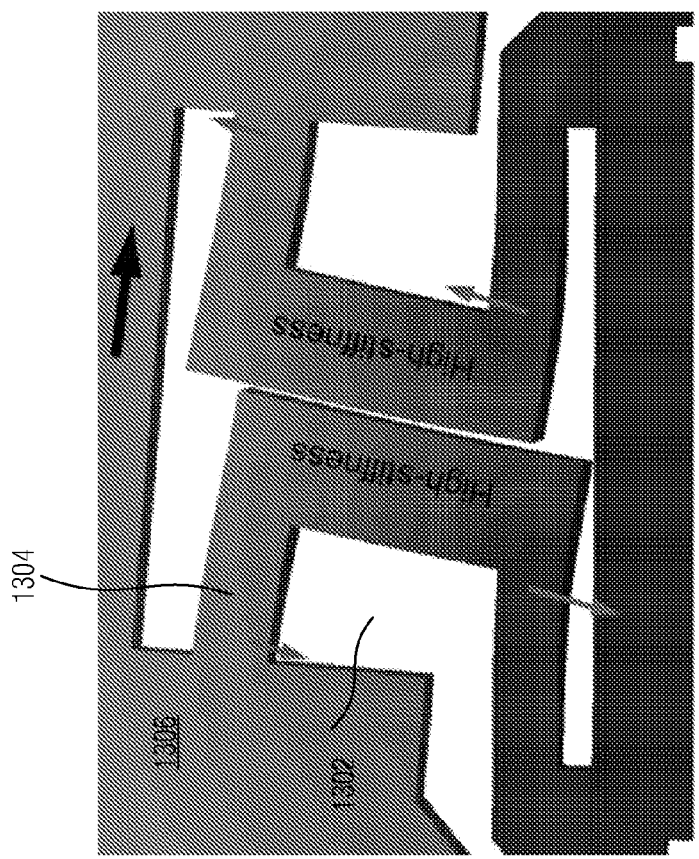
FIG. 13A
FIG. 13B

FLEXURE BEARING TO REDUCE QUADRATURE FOR RESONATING MICROMACHINED DEVICES

CLAIM OF PRIORITY AND RELATED APPLICATIONS

The present application is a U.S. National Stage Filing under 35 U.S.C. 371 from International Patent Application Serial No. PCT/US2011/052006, filed on Sep. 16, 2011, and published on Mar. 22, 2012 as WO 2012/037501 A2, which claims the benefit of priority of U.S. Provisional Patent Application Ser. No. 61/384,247, entitled "LOW-QUADRATURE SUSPENSION SYSTEM FOR MULTI-AXIS GYROSCOPES," filed Sep. 18, 2010 and U.S. Provisional Patent Application Ser. No. 61/384,512, entitled "IMPROVED QUADRATURE REDUCTION STRUCTURE FOR RESONATING MICROMACHINED DEVICES," filed Sep. 20, 2010, each of which is incorporated by reference in its entirety.

The present application is related to U.S. patent application Ser. No. 12/849,742, entitled "MICROMACHINED INERTIAL SENSOR DEVICES," filed Aug. 3, 2010; U.S. patent application Ser. No. 12/849,787, entitled "MICROMACHINED DEVICES AND FABRICATING THE SAME," filed Aug. 3, 2010 and U.S. Provisional Patent Application Ser. No. 61/384,240, entitled "MICROMACHINED MONOLITHIC 6-AXIS INERTIAL SENSOR," filed Sep. 18, 2010, each of which is incorporated by reference in its entirety.

BACKGROUND

Quadrature error is one of the primary factors that limit the performance of micromachined sensors such as gyroscopes. Considering the relative magnitudes of the drive and sense oscillations, even an extremely small part of the drive motion coupling into a sense-mode could dominate over the Coriolis response.

Practically, fabrication imperfections may result in less-than-ideal geometries in structures such as gyroscope structures. Less-than-ideal geometries can cause a drive oscillation to partially couple into a sense-mode. Even though several cross-coupling approaches exist, such as elastic, viscous and electrostatic coupling approaches, in certain cases the elastic coupling due to anisoelasticity in the suspension elements increases in magnitude beyond a desired level.

In sensor systems such as gyroscope systems with out-of-plane operational modes, anisoelasticity between the in-plane and out-of-plane directions is the dominating source of Quadrature error. Sidewall tilt or skew in deep reactive-ion etching ("DRIE") can result in deviation of the cross-section of the flexure bearings from a rectangle to a parallelogram, causing the principle axes of elasticity of the suspension flexure bearings to deviate from parallel and orthogonal to the device surface. In an example, single or multi-axis micromachined sensor structures such as gyroscope structures can suffer from high-quadrature error caused at least in part by DRIE skew.

Additionally, prior resonators rely on simple straight flexure bearings to generate a flexing structure to allow the device to displace in resonance. This creates significant problems when etching creates a skew in the flexure bearing, causing large undesired displacement, often actuating a sense mechanism.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 13A illustrates a suspension with large clearances, according to an example.

FIG. 13B illustrates stresses related to flexing of flexures bearings.

DETAILED DESCRIPTION

Unwanted sidewall flex can negatively affect the performance of flexure bearings ("flexures"), such as flexure bearings that support one or more portions of a microelectromechanical systems ("MEMS") structure such as a die. In an example, if one or more sidewalls have an angle error, an in-plane drive motion can cause out-of-plane motion, such as when the skew axis is along a flexure bearing or beam length. In an example, when skewed pliable or compliant flexure bearings or beams are located on opposite sides of a drive motion, a resulting out-of-plane deflection can cause or contribute to quadrature error. In an example, a low-quadrature suspension system aims at reducing or cancelling undesired out-of-plane motion.

Figure 1:
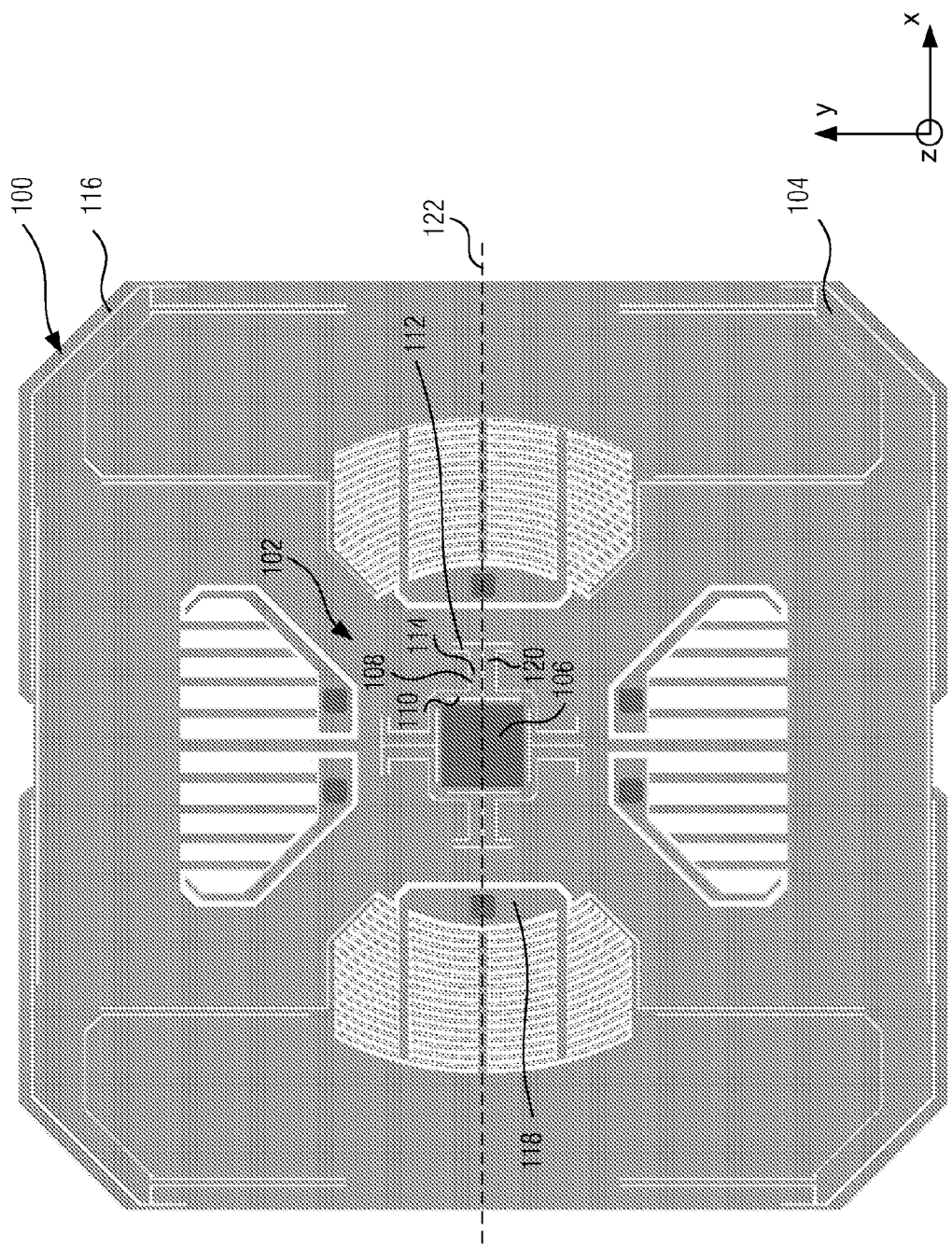
FIG. 1 illustrates a sensor structure including a suspension structure, according to an example.

FIG. 1 illustrates a sensor structure including a suspension structure, according to an example. Various examples disclose a low-quadrature suspension system for a sensor. In an example, a suspension structure can be utilized in a torsional multi-axis micromachined gyroscope system with a proof-mass such as a single proof-mass 104. In an example, a proof-mass 104 is suspended at its center with a single central anchor 106. In an example, one or more flexure bearings connect the anchor 106 to the proof-mass 104, such as to the proof-mass main frame 116. In an example, one or more flexures allow the proof-mass to oscillate torsionally about three perpendicular axes. In an example, suspension flexure bearings or beams provide in-plane and out-of-plane deflections, allowing the proof-mass to oscillate torsionally about the x, y, and z axes.

An example includes a fixed portion 118, wherein the anchor 106 is coupled to the fixed portion 118. In an example, a first nonlinear suspension member 108 is coupled to anchor 106 on a side of the anchor. In an example, a second nonlinear suspension member 120 coupled to the anchor on the same side of the anchor, the second nonlinear suspension member having a shape and location mirroring the first nonlinear suspension member about an anchor bisecting plane 122, such as a x-z plane. Various examples include a proof-mass 104 that is planar, the proof mass suspended at least in part by the first nonlinear suspension member 108 and the second nonlinear suspension member 120 such that the proof-mass is rotable about the anchor 106 and is slideable in a plane parallel to the fixed portion, such as in the x-y plane.

In an example, a C-shaped flexure bearing 108 includes a inner portion 110 coupled to the anchor 106 and extending toward the anchor bisecting plane 122, a center portion 114 having a proximal portion and a distal portion, with a proximal portion coupled to the inner portion 110 and a distal portion extending away from the anchor 106 along the anchor bisecting plane 122 and coupled to a outer portion 112 extending away from the anchor bisecting plane 122. In an example, the center portion 114 is perpendicular the inner portion 110 and the outer portion 112. In an examples, the center portion 114 is parallel the anchor bisecting plane 122.

In an examples, the anchor 106, the first nonlinear suspension member 108, the second nonlinear suspension member 120 and the proof-mass 104 are formed of a monolithic material. In an example, the fixed portion 118 comprises a fixed monolithic material other than the monolithic material of the anchor 106, the first nonlinear suspension member 108, the second nonlinear suspension member 120 and the proof-mass 104. In an example, the fixed portion 118 comprises a fixed monolithic material the same as the monolithic material of the anchor 106, the first nonlinear suspension member 108, the second nonlinear suspension member 120 and the proof-mass 104.

In an example, flexure bearings are disposed on each side of the central anchor, such as on opposite sides of the anchor. In an example, out-of-plane motion caused by each C-shaped flexure bearing on a side is cancelled out by its symmetric counterpart. Accordingly, in an example, the quadrature error induced on each flexure bearing is locally reduced or cancelled.

In an example, a central suspension structure 102 is utilized in a sensor, such as a 6 degree of freedom ("DOF") sensor 100, such as a monolithic 6-DOF sensor, that is comprised of symmetric flexures bearings. In an example, the symmetric flexure include "C-shaped flexure bearings" 108. In an example, each C-shaped flexure bearing includes inner 110 and outer 112 flexure bearings and a high-stiffness connection flexure bearing 114 between two flexure bearings. In an example, the inner flexure bearing 112 is connected to the anchor 106 on one end, and the outer flexure bearing 112 is connected to the proof mass 104 on another end. In an example, the suspension system 102 is formed by a total of eight C-shaped flexure bearings 108. In an example, two symmetric C-shaped flexure bearings are located on each of the four sides of a central anchor structure.

In an example, a suspension system provides three gyroscope operational modes: torsional in-plane about the z-axis for the drive motion; torsional out-of-plane about the x-axis for the y-axis gyroscope sense motion; and torsional out-of-plane about the y-axis for the x-axis gyroscope sense motion. In an example, the oscillation modes can be switched between each other.

Figure 2B:
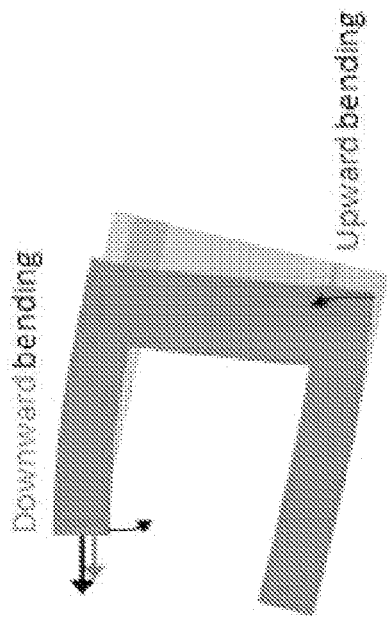
FIG. 2B illustrates the suspension of FIG. 8A, in a bending state in which a top portion is bent upward, in an example.
Figure 2C:
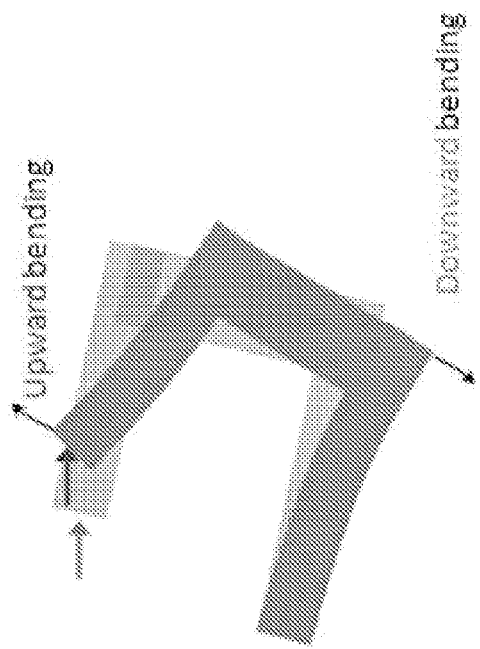
FIG. 2C illustrates the suspension of FIG. 8A, in a bending state in which a top portion is bent downward, in an example.
Figure 2A:
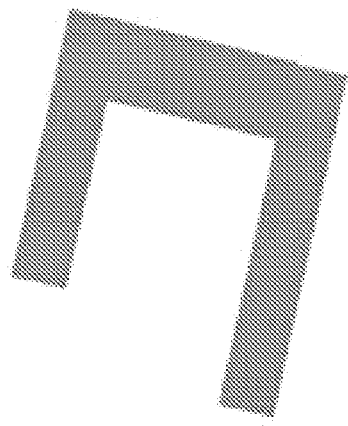
FIG. 2A illustrates a portion of a suspension, according to an example.

FIG. 2A illustrates a portion of a suspension, according to an example. FIG. 2B illustrates the suspension of FIG. 2A, in a bending state in which a top portion is bent upward, in an example. FIG. 2C illustrates the suspension of FIG. 2A, in a bending state in which a top portion is bent downward, in an example. The examples shown illustrate the deformation profile in each direction of the suspension mechanism. In an example, bending occurs equal and opposite in both deformation cases illustrates in FIG. 2B and FIG. 2C. In an example, in each direction the two flexure bearings bend in opposite ways. In an example, by creating opposing out-of-plane deformations that cancel each other, the overall out-of-plane deformation from one end of the flexure to the other is minimized.

Figure 3:
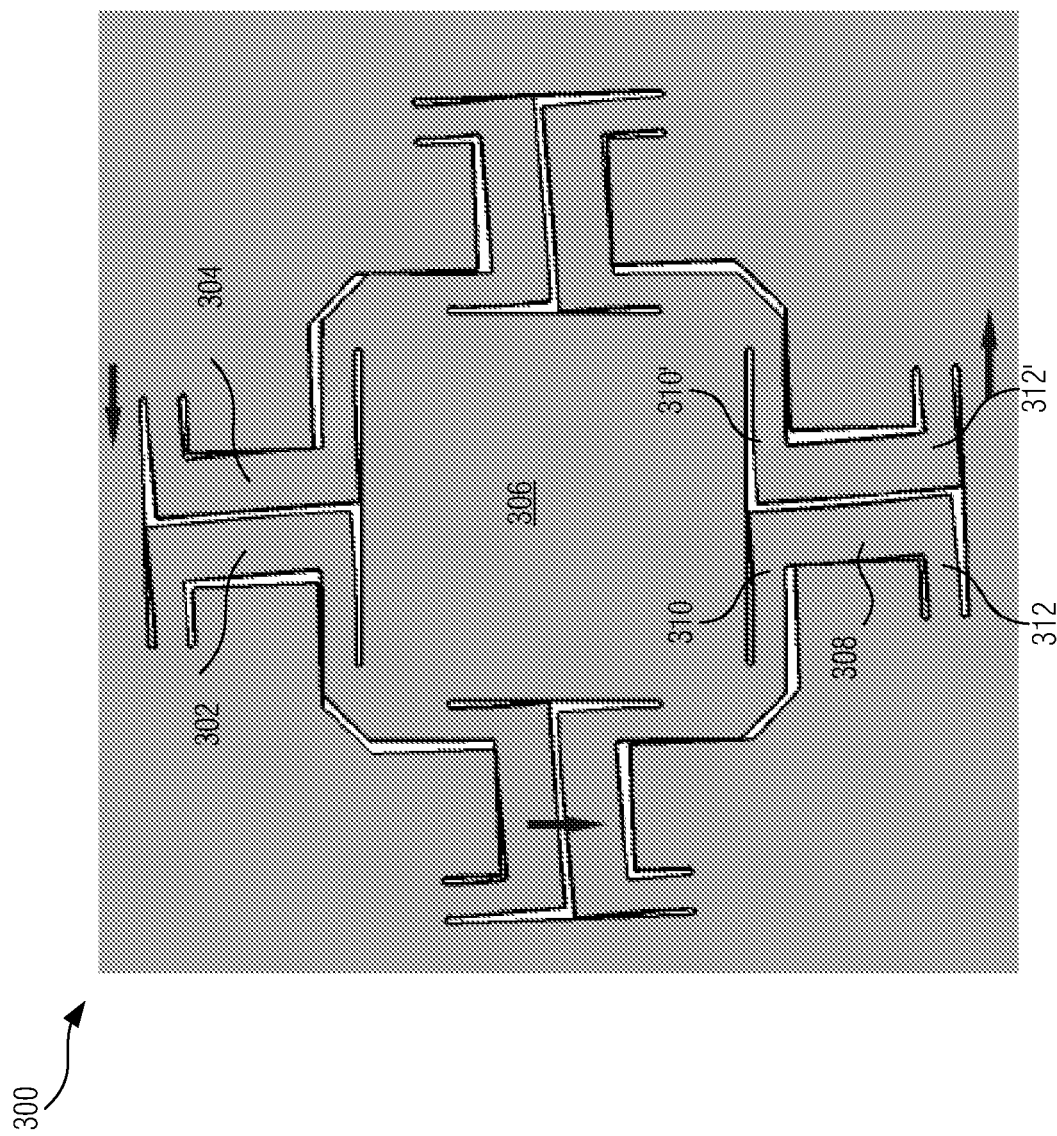
FIG. 3 illustrates torsional motion of a suspended structure about a z-axis, according to an example.

FIG. 3 illustrates torsional motion of a suspended structure about a z-axis, according to an example. In an example, a suspension system 300 comprises two symmetric C-shaped flexure bearings 302, 304 on each side of a central anchor structure 306. In an example, one or both of the C-shaped flexure bearings 302, 304 is formed of a high-stiffness connection flexure bearing 308 disposed between two flexure bearings 310, 312. In an example, during in-plane torsional motion, such as motion parallel to the plane of the figure, the out-of-plane motion caused by the deflection of the flexure bearings in each C-shaped flexure bearing on a side is cancelled out by a symmetric counterpart 310', 312'. Accordingly, quadrature error induced on each flexure bearing is locally reduced or cancelled.

The illustrated example illustrates torsional motion about a Z-Axis, i.e. an axis extending into and out of the page. In an example, during the in-plane torsional motion, the inner 310 and outer 312 flexure bearings in each C-shaped flexure bearing bend in-plane. In an example, the high-stiffness connection bearings 308 do not experience significant bending. For a counterclockwise rotation of the proof-mass about the z-axis, top part of the proof mass moves left as shown. In an example, the high-stiffness connection bearings both move left. As a result, the inner and outer flexures on the right C-shaped flexure bearing bend down, while the ones on the left C-shaped flexure bearing bend up. Thus, in an example, the motion results in deflections in opposite directions in the symmetric C-shaped flexure bearing flexures. Since the flexures in symmetric C-shaped flexure bearings deflect in opposite directions, the out-of-plane motion caused by the deflection of the flexure bearings in each C-shaped flexure bearing on a side is cancelled out by its symmetric counterpart. Thus, the quadrature error induced on each flexure bearing is locally cancelled.

Figure 4:
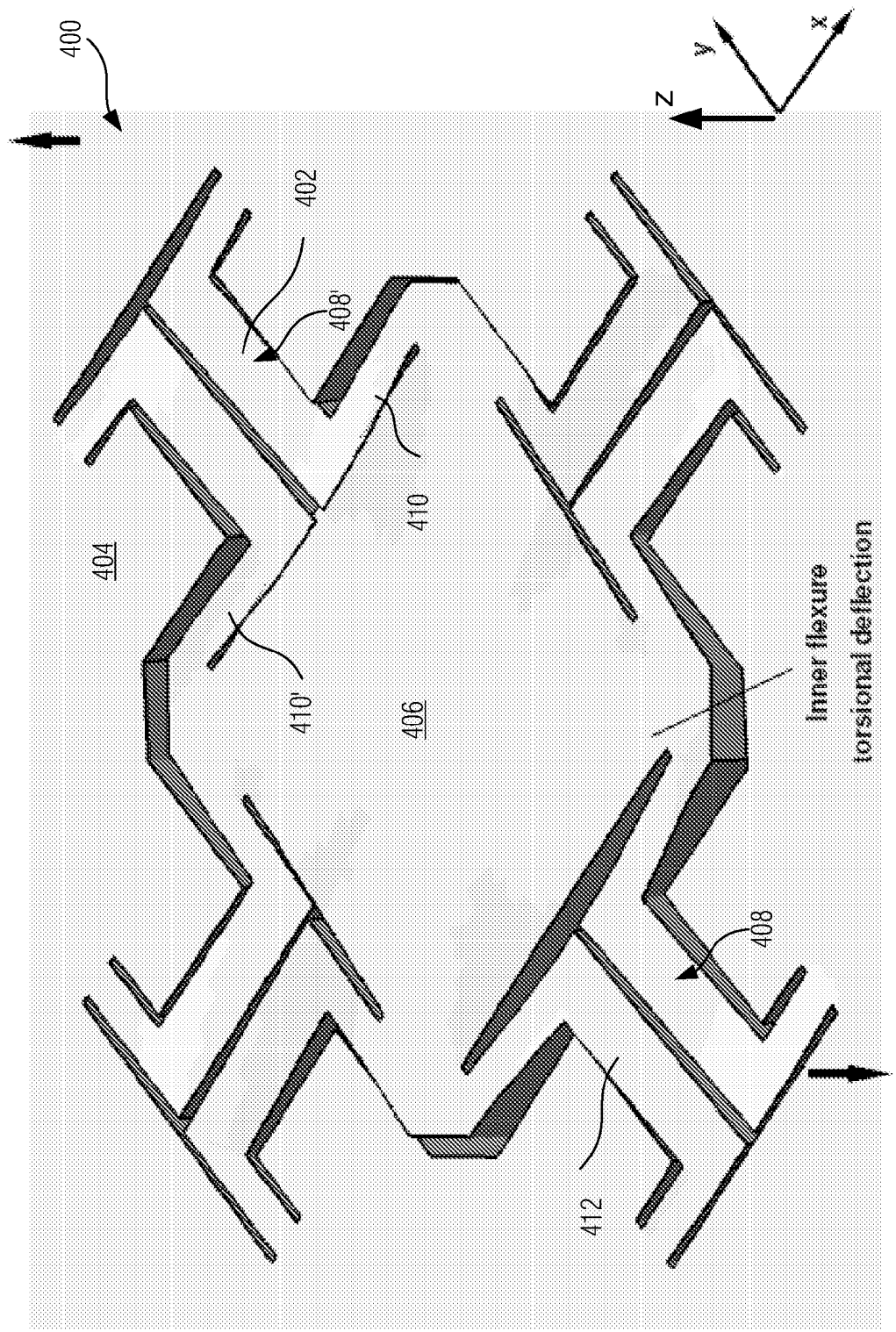
FIG. 4 illustrates torsional motion of a suspended structure about an x-axis, according to an example.

FIG. 4 illustrates torsional motion of a suspended structure about an x-axis, according to an example. In an example, a suspension structure can be utilized in a torsional multi-axis micromachined gyroscope system with a proof-mass such as a single proof-mass 404. In an example, a proof-mass 404 is suspended at its center with a single central anchor 406. In an example, one or more flexure bearings 402 connect the anchor 406 to the proof-mass 404. In an example, during the out-of-plane torsional motion about the x-axis, primarily the C-shaped suspension pairs 412, 412' on the y-axis sides of the anchor deflect. In an example, the inner flexure bearings 410, 410' in these C-shaped suspensions bend torsionally about the x-axis, acting as a torsional hinge.

In an example, the die is wafer shaped, with each of a first nonlinear suspension member 408 and a second nonlinear suspension member 412 having a substantially rectangular cross-section with the height of the cross-section smaller than the width.

Figure 5:
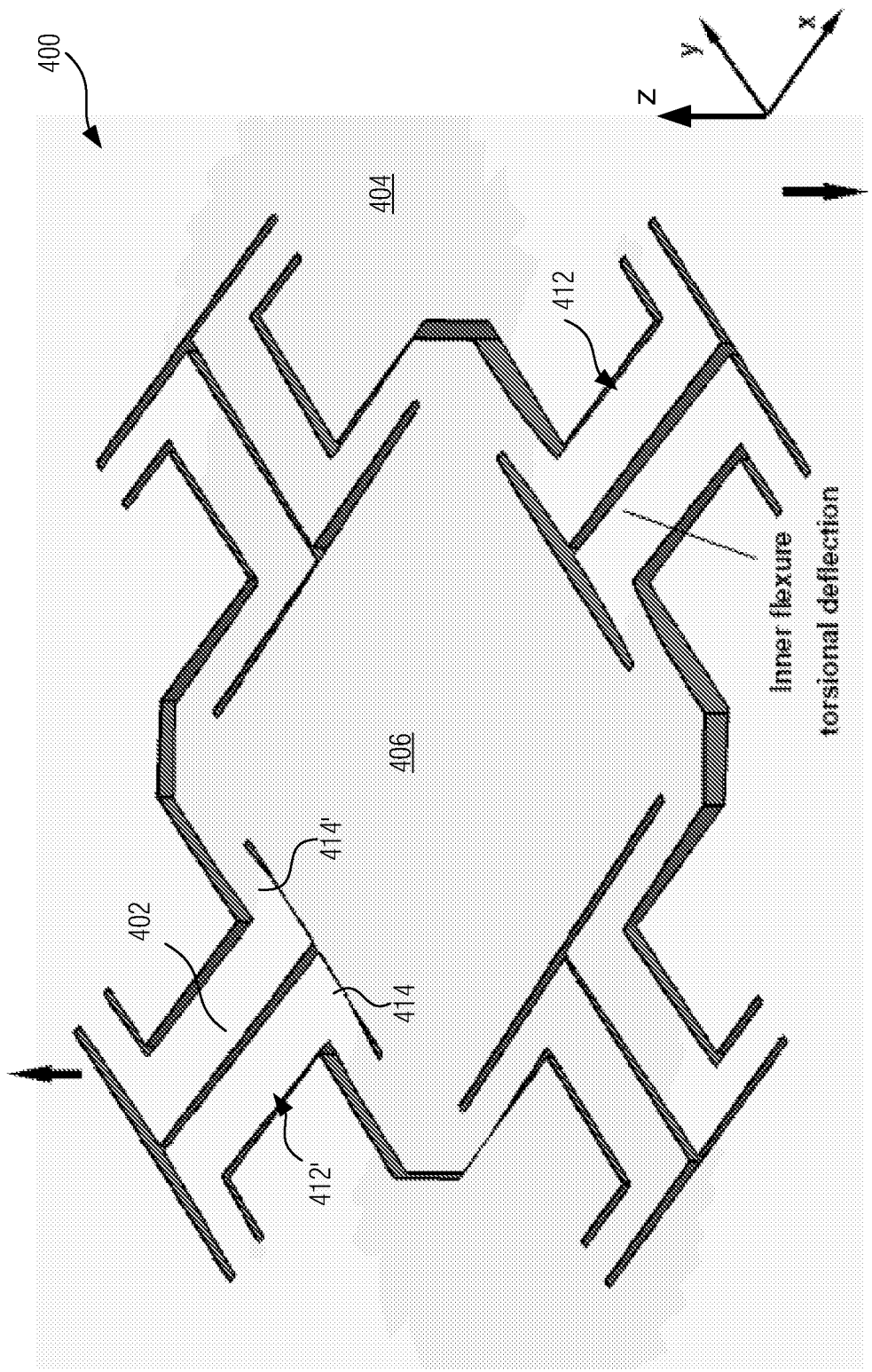
FIG. 5 illustrates torsional motion of a suspended structure about a y-axis, according to an example.

FIG. 5 illustrates torsional motion of a suspended structure about a y-axis, according to an example. In an example, a suspension structure can be utilized in a torsional multi-axis micromachined gyroscope system with a proof-mass such as a single proof-mass 404. In an example, a proof-mass 404 is suspended at its center with a single central anchor 406. In an example, one or more flexure bearings 402 connect the anchor 406 to the proof-mass 404. In an example, during the out-of-plane torsional motion about the y-axis, primarily the C-shaped suspension pairs 412, 412' on the x-axis sides of the anchor deflect. The inner flexure bearings in these C-shaped flexure bearings 414, 414' bend torsionally about the y-axis, acting as a torsional hinge.

Figure 6:
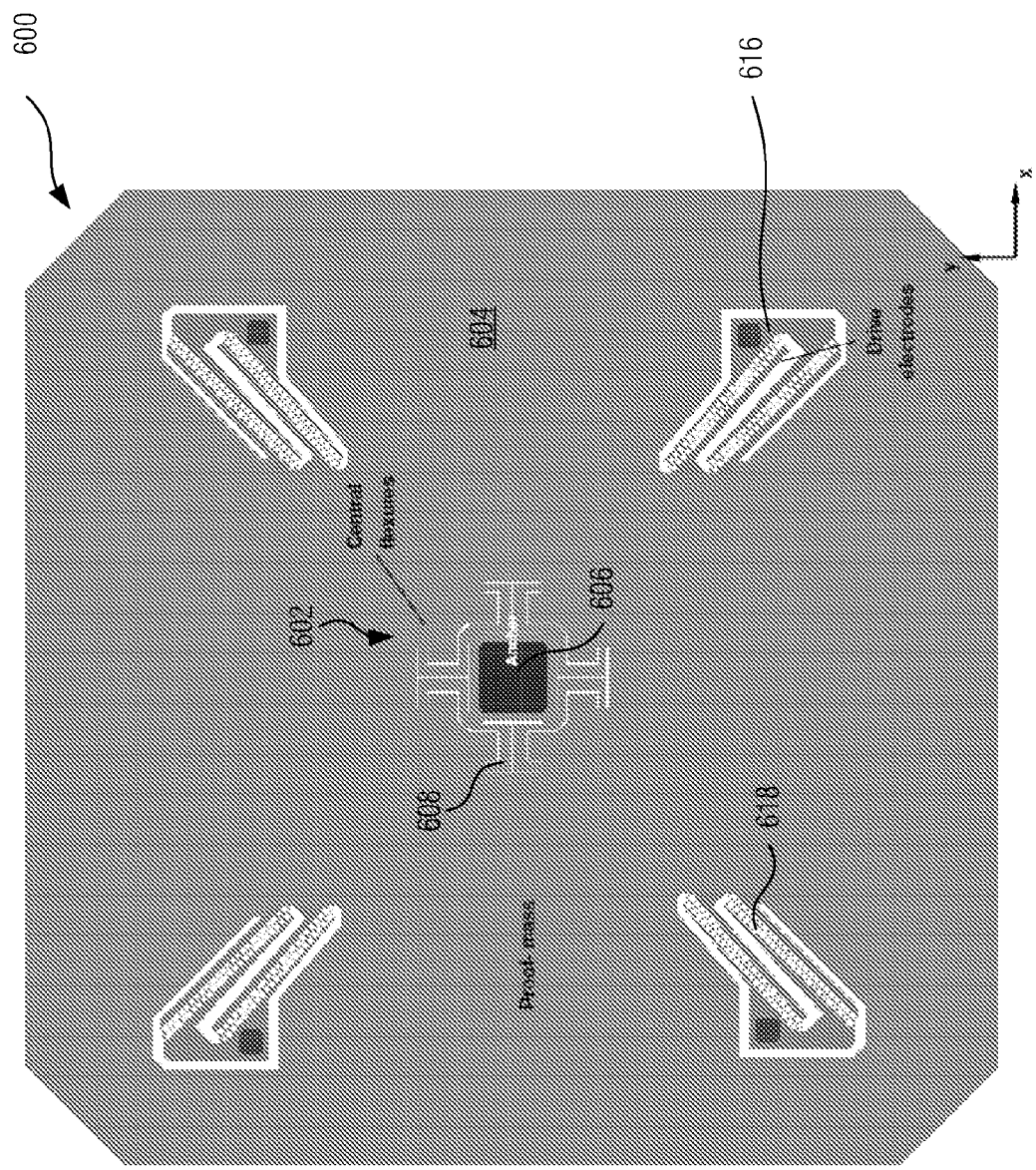
FIG. 6 illustrates a 2-Axis Gyroscope including a low quadrature error suspension, according to an example.

FIG. 6 illustrates a 2-Axis Gyroscope including a low quadrature error suspension, according to an example. In an example, a structure 602 can be utilized in various torsional multi-axis micromachined gyroscope systems with a single proof-mass 604 that is suspended at its center with a single central anchor 606. The flexures 608 connect the anchor to the proof-mass 604, and allow the proof-mass to oscillate torsionally about all three axes. The illustrated example senses motion about each of the x-axis and the y-axis, and proves three gyroscope operational modes: torsional in-plane about the z-axis for the drive motion; torsional out-of-plane about the x-axis for the y-axis gyroscope sense motion; and torsional out-of-plane about the y-axis for the x-axis gyroscope sense motion. In an example, one or more comb electrodes 616 are coupled to a fix portion of the device and sense motion of comb electrodes 618 coupled to the proof mass 604. In an example, the comb teeth of the comb electrodes 618 are disposed along an axis that bisects an angle between the x-axis and the x-axis.

Figure 7:
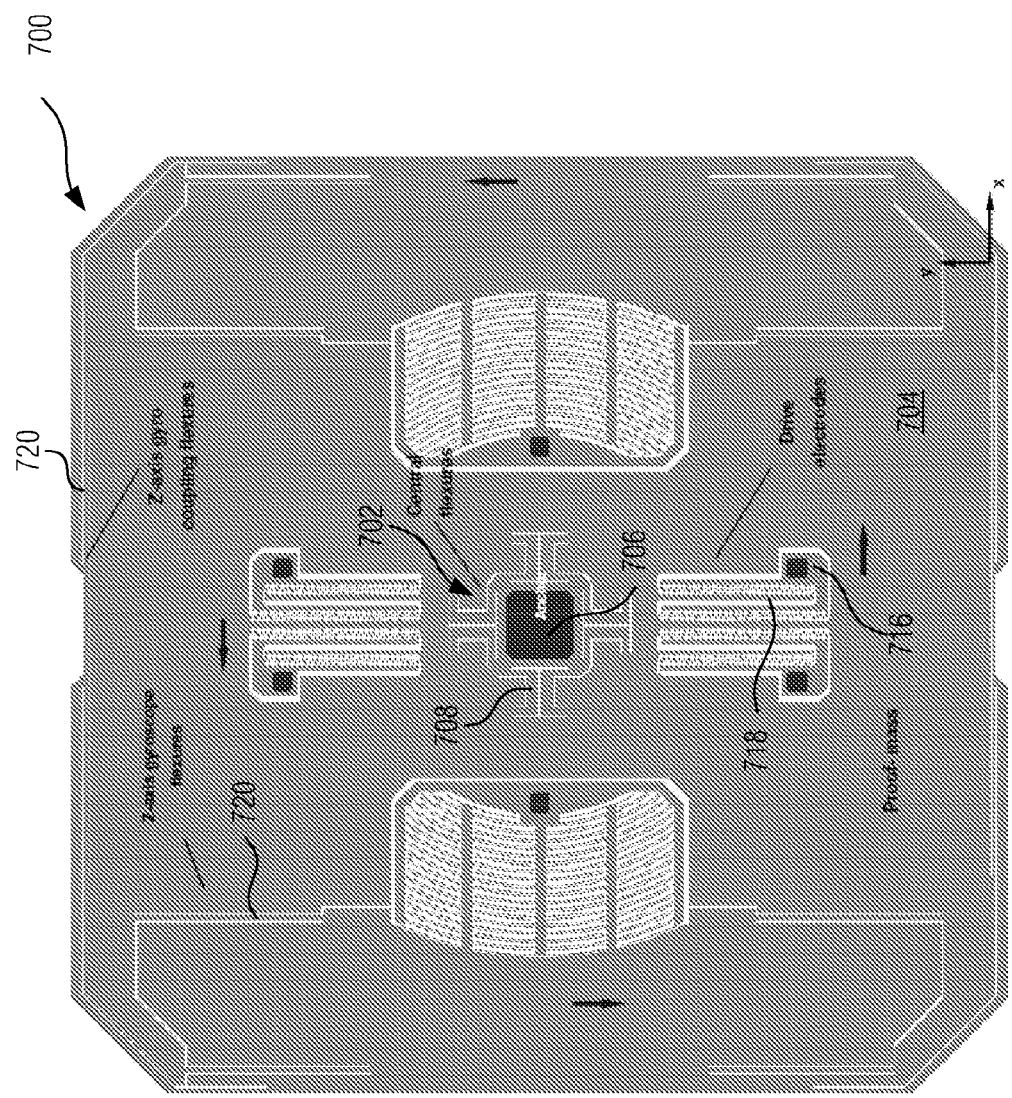
FIG. 7 illustrates a 3-Axis Gyroscope including a low quadrature error suspension, according to an example.

FIG. 7 illustrates a 3-Axis Gyroscope including a low quadrature error suspension, according to an example. In an example, a structure 702 can be utilized in various torsional multi-axis micromachined gyroscope systems with a single proof-mass 704 that is suspended at its center with a single central anchor 706. The flexures 708 connect the anchor to the proof-mass 704, and allow the proof-mass to oscillate torsionally about all three axes. In an example, a device function as an a three-axis ("X/Y/Z") gyroscope. In an example, the suspension system 702 provides similar gyroscope operational modes to the device illustrated in FIG. 6. In an example, the illustrated device of FIG. 7 includes additional flexures 720 that provide for the Z-axis sense mode. In an example, one or more comb electrodes 716 are coupled to a fix portion of the device and sense motion of comb electrodes 718 coupled to the proof mass 704. In an example, the comb teeth of the comb electrodes 718 are disposed along an axis that bisects an angle between the x-axis and the x-axis.

Figure 8:
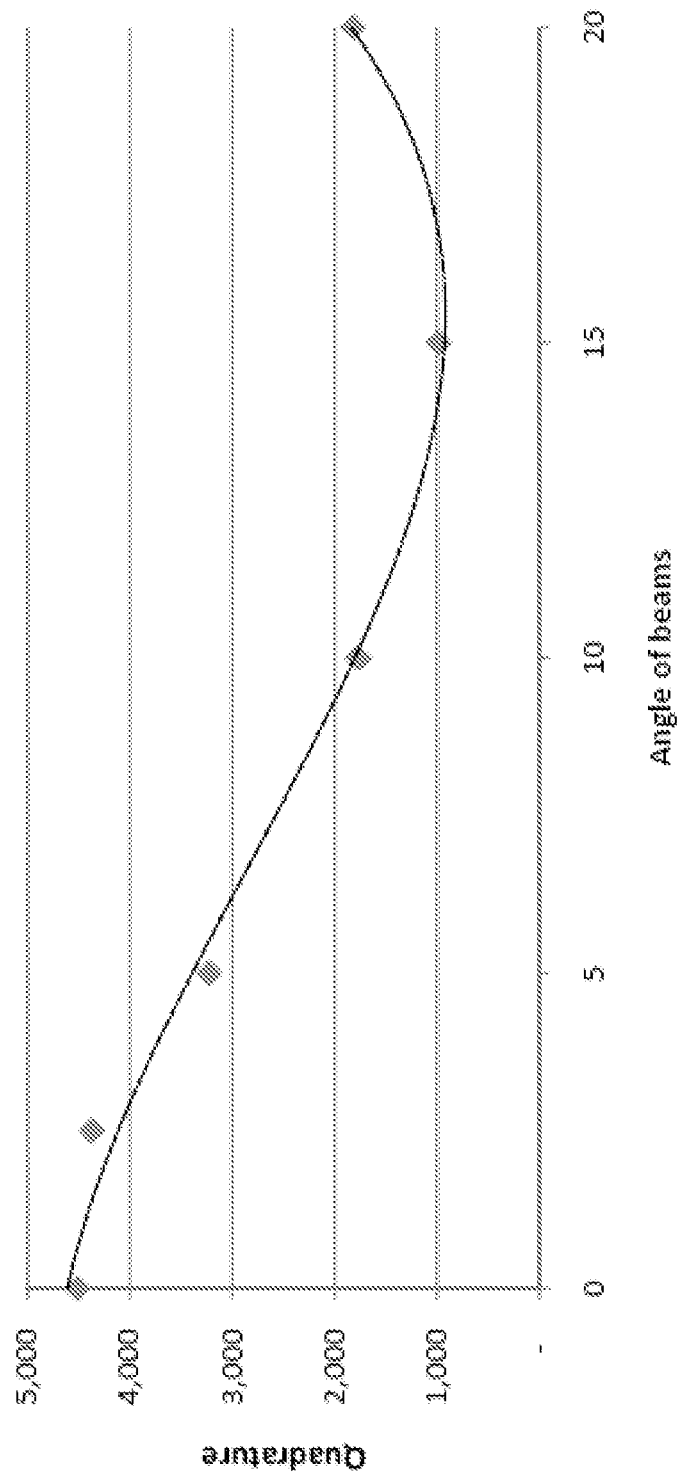
FIG. 8 illustrates quadrature error for an example suspension.

FIG. 8 illustrates quadrature error for an example suspension. In an example, the angle of the flexure bearings has a significant effect on the quadrature. In an example, for each design the angle can be chosen to optimize the quadrature error arising from skew of the resonator flexure bearing flexures. In an example, for the desired implementation of the suspension system, the optimal angle is 15 degrees. In an example, the optimal angle is structure shape dependent, and is selected based on the structure of a respective device. In an example, for a desired structure, two flexure bearings are set at the same angular shift, but two flexure bearings could easily be set at different angles.

Figure 9:
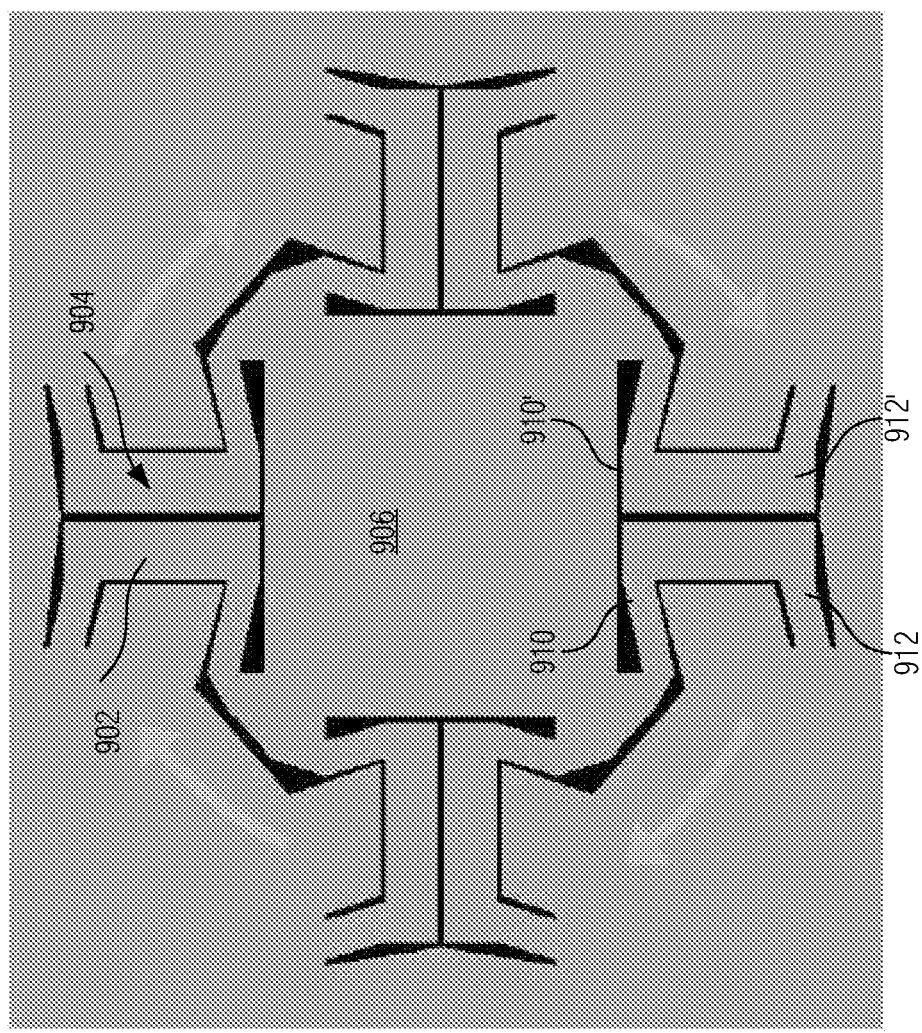
FIG. 9 illustrates a drive mode, according to an example.

FIG. 9 illustrates a drive mode, according to an example. The inventors recognized that skew effect creates quadrature errors in suspension configurations including an anchor 906, and that they could minimize the effect by creating opposite skews on the same flexure 902 or flexure pair 904. Accordingly, there are two flexing flexure bearings separated by a frame, each of which deforms in the opposite direction in the drive mode of operation. The opposite directions of the deformation cause the skew to create out-of-plane deformation in opposite directions, which cancel each other out at the final connection to the moving component. This is used to replace an existing mechanism which only includes one flexure bearing, the skew of which causes deformation in only one direction, creating a lot of out-of-plane motion without any canceling.

However, in some examples, the inner 910, 910' and outer 912, 912' flexure bearings are rotated so that deformation causes one flexure bearing to bend up and one flexure bearing to bend downward during drive mode actuation. In an example, the drive mode is a rotational mode about a central anchor. In an example, for each of the four suspension pairs 404, the drive mode causes one to deform in one direction and the other in the other direction.

Figure 10:
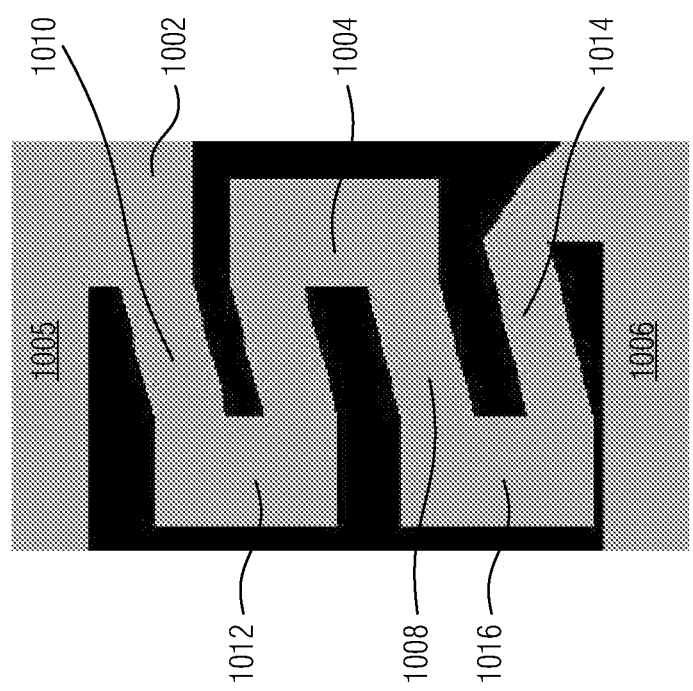
FIG. 10 illustrates a four bend flexure bearing, according to an example.

FIG. 10 illustrates a four bend flexure bearing, according to an example. In an example, the flexure 1002 can include more than one bend. In an example, this can allow for more tightly controlled out-of-plane motion. In an example, a number of switchbacks 1004 are included. In an example, the switchbacks define a zigzag that extends from the anchor 1006 to the proof-mass 1005. In an example, the zigzag includes switchbacks of a regular amplitude along the patter extending from the anchor 1006 to the proof-mass 1005. In additional embodiments, the amplitude varies. In an example, the switchbacks have a C-shape, with top 1008 and bottom 1014 members parallel to one another, but not parallel to a high-stiffness portion 1016.

Figure 11:
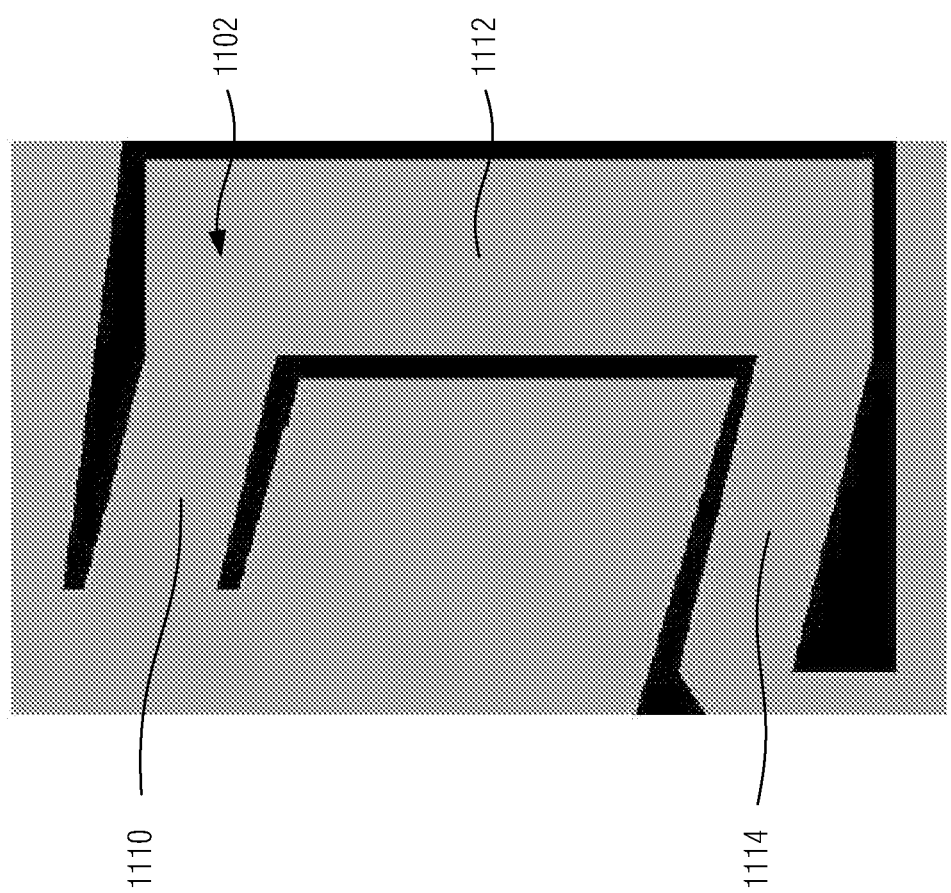
FIG. 11 illustrates a flexure bearing including a flexing flexure bearing and a non-flexing flexure bearing, according to an example.

FIG. 11 illustrates a flexure bearing including a flexing flexure bearing and a non-flexing flexure bearing, according to an example. In an example, a flexure 1102 can also be parameterized by lengthening or shortening the flexing flexure bearings 1110, 1114 or the non-flexing flexure bearing(s) 1112. In the example shown in FIG. 12, the outer flexing flexure bearing 1110 and non-flexing flexure bearing 1112 have been shortened.

Figure 12:
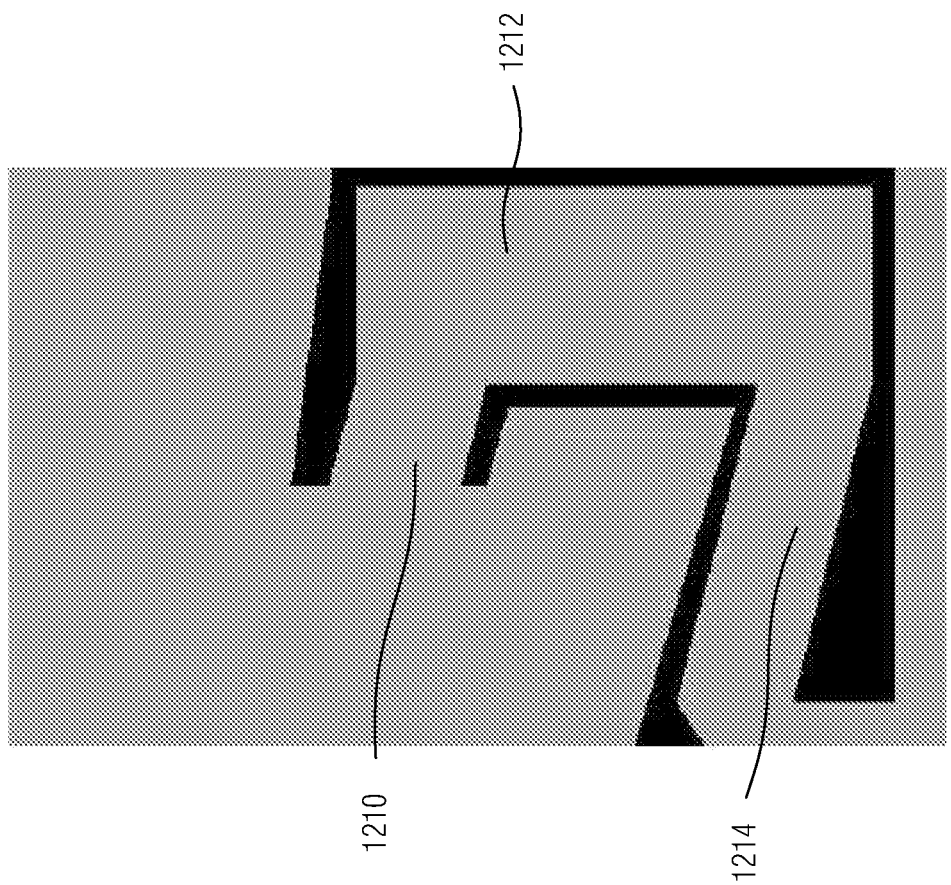
FIG. 12 illustrates a flexure bearing including a flexing flexure bearing shorter than the flexure bearing of FIG. 11, and a non-flexing flexure bearing shorter than the non-flexing flexure bearing of FIG. 11, according to an example.

FIG. 12 illustrates a flexure bearing including a flexing flexure bearing shorter than the flexure bearing of FIG. 11, and a non-flexing flexure bearing shorter than the non-flexing flexure bearing of FIG. 11, according to an example. The outer flexing flexure bearing 1210 and non-flexing flexure bearing 1212 have been shortened compared to the components of FIG. 11.

FIG. 13A illustrates a suspension with large clearances, according to an example. FIG. 13B illustrates stresses related to flexing of flexures bearings. In the examples, there are voids 1302 disposed between the flexure bearing 1304 and the proof-mass 1306.

Figure 14:
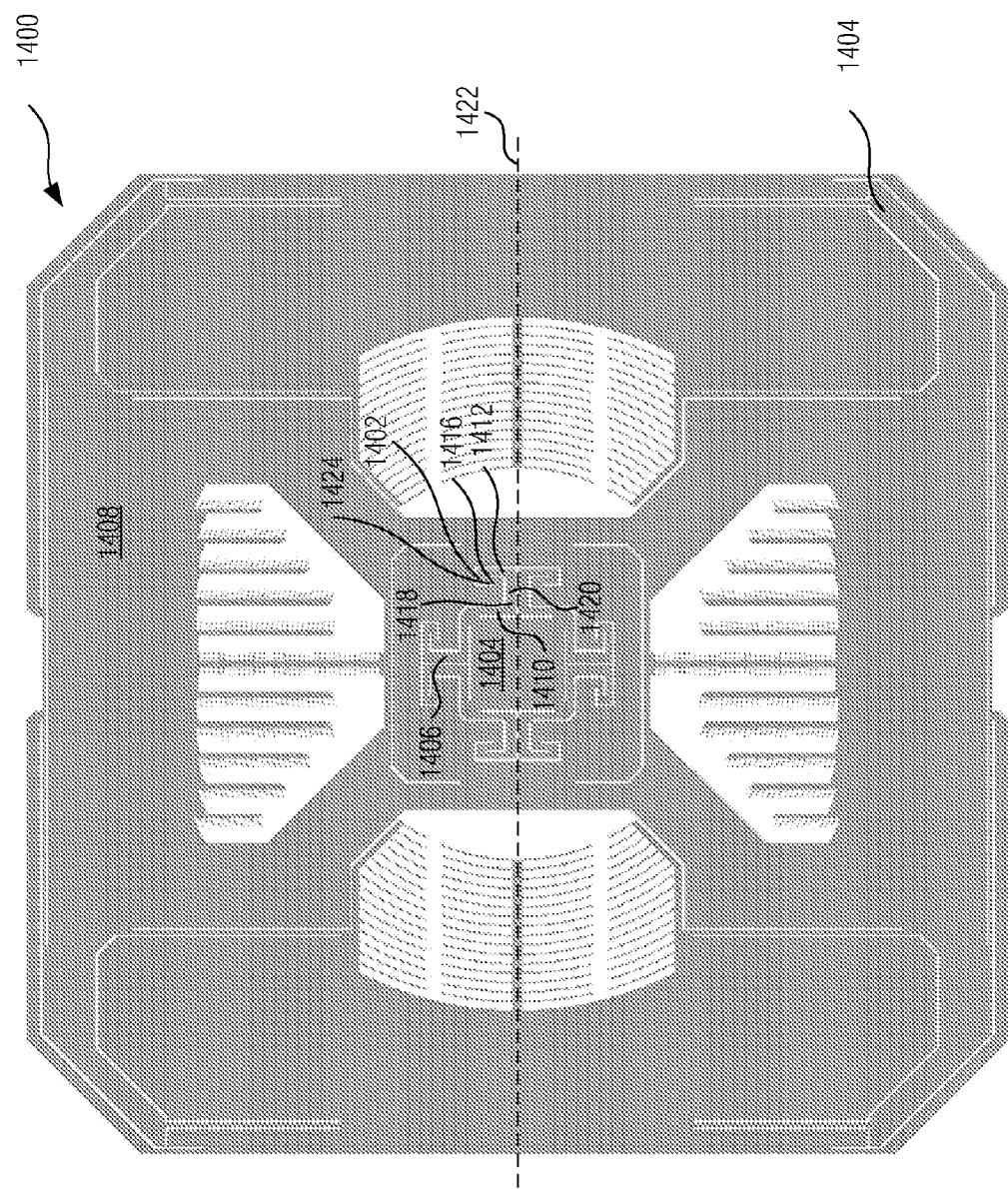
FIG. 14 illustrates a suspension including a switchback, according to an example.

FIG. 14 illustrates a die 1400 including a suspension including a switchback, according to an example. The switchback 1402 extends between the C-shaped flexure bearing 1406 and the proof mass 1408. The addition of the switchback 1402 further reduces quadrature error, at least because it reduces out-of-plane flexing due at least in part to DRIE etching.

In an example, the outer portion 1412 of a first nonlinear suspension member 1416 has a proximal portion coupled to the center portion 1420 of the first nonlinear suspension member 1416, and a distal portion extending away from the anchor bisecting plane 1422, with a fourth portion 1402 of the first nonlinear suspension member 1416 coupled to the distal portion of the outer portion at a proximal portion of the fourth portion 1402, and extending toward the anchor 1404 to a distal portion of the fourth portion that is coupled to a fifth portion 1424 of the first nonlinear suspension member that extends toward the anchor bisecting plane 1422. In an example, the inner portion 1410 and the outer portion 1412 are linear and parallel.

Figure 15:
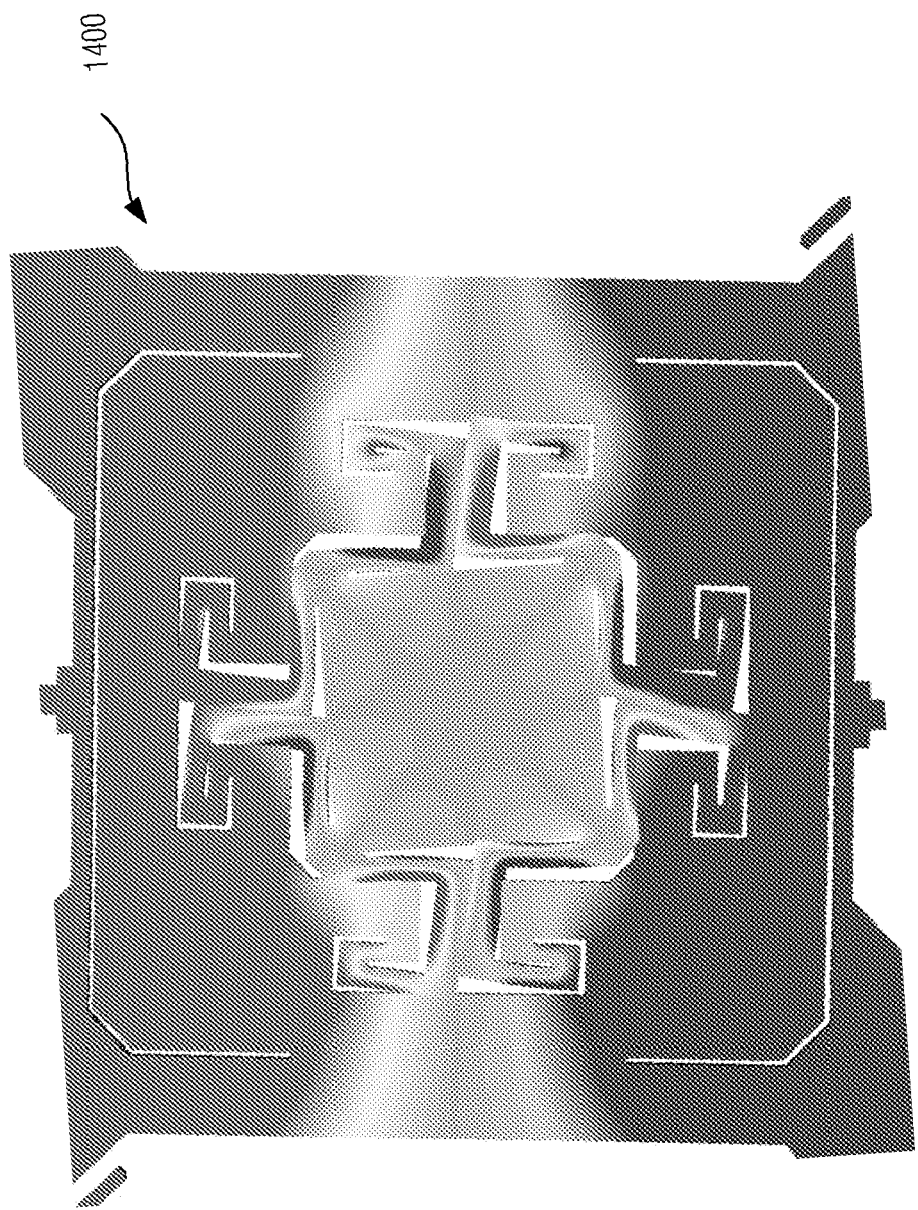
FIG. 15 illustrates the suspension of FIG. 14 flexed in torsion around a z-axis, according to an example.
Figure 16A:
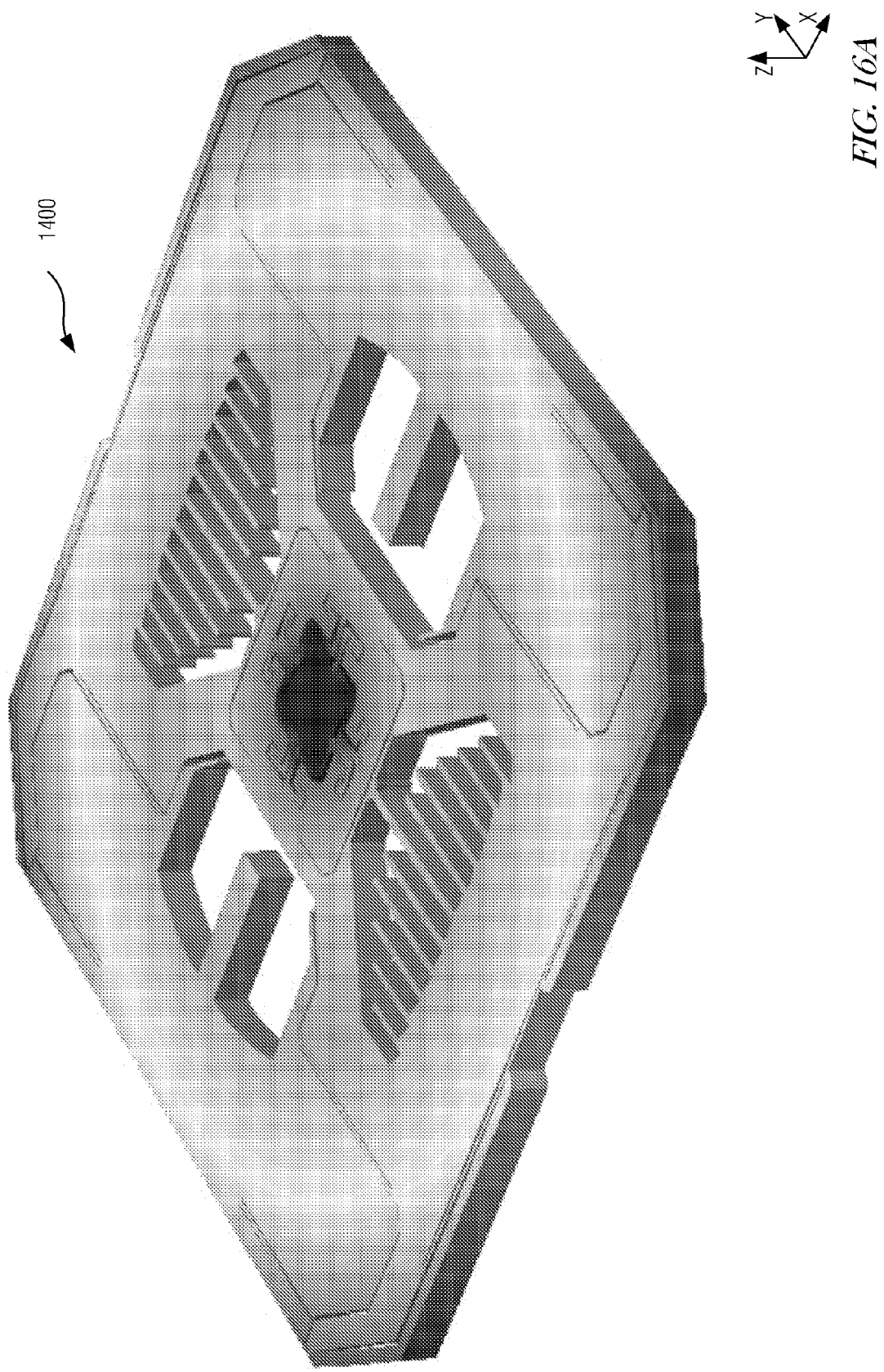
FIG. 16A illustrates the suspension of FIG. 14 flexed in torsion around a z-axis, according to an example.
Figure 16B:
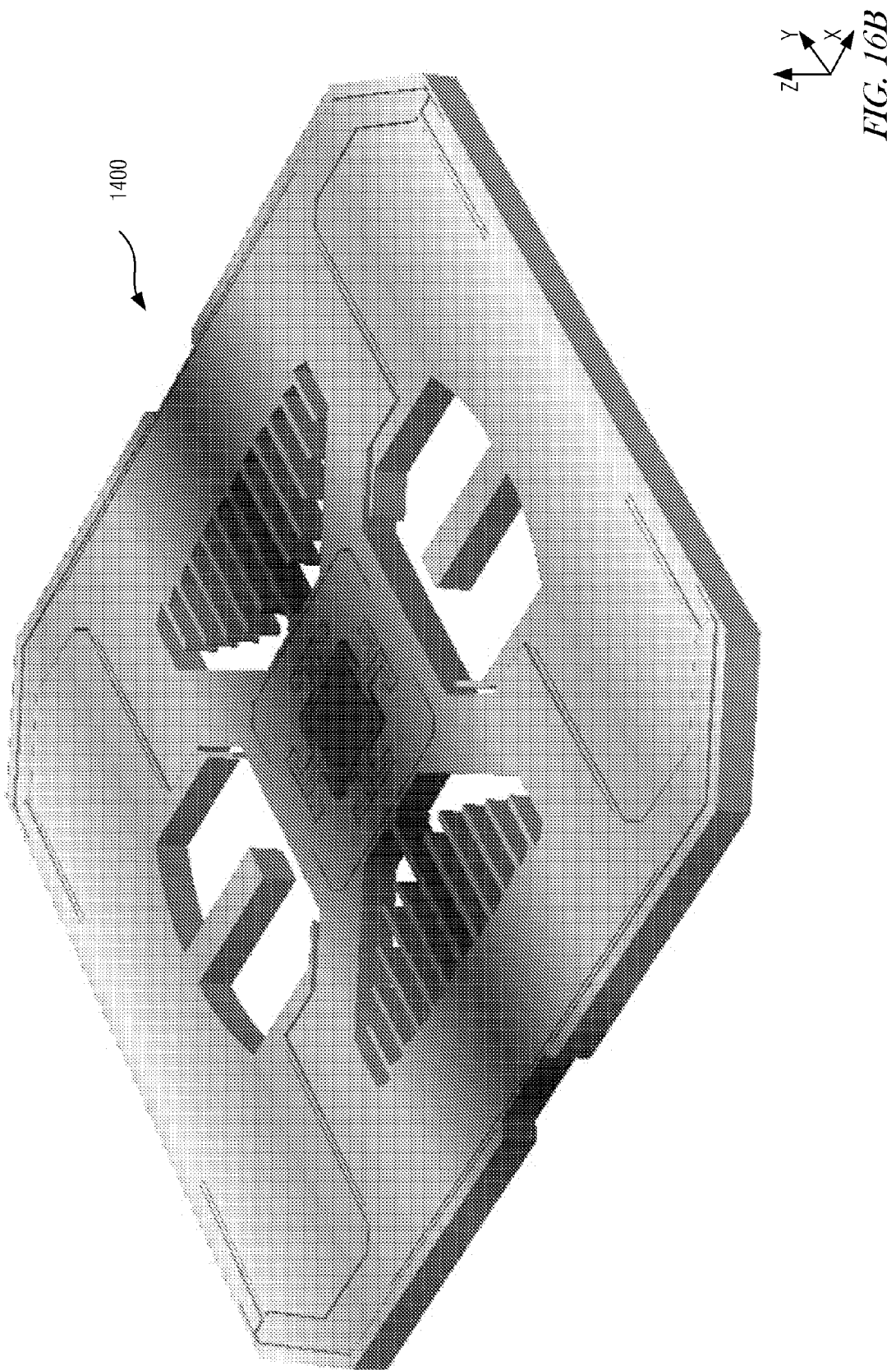
FIG. 16B illustrates the suspension of FIG. 14 flexed about a y-axis, according to an example.
Figure 16C:
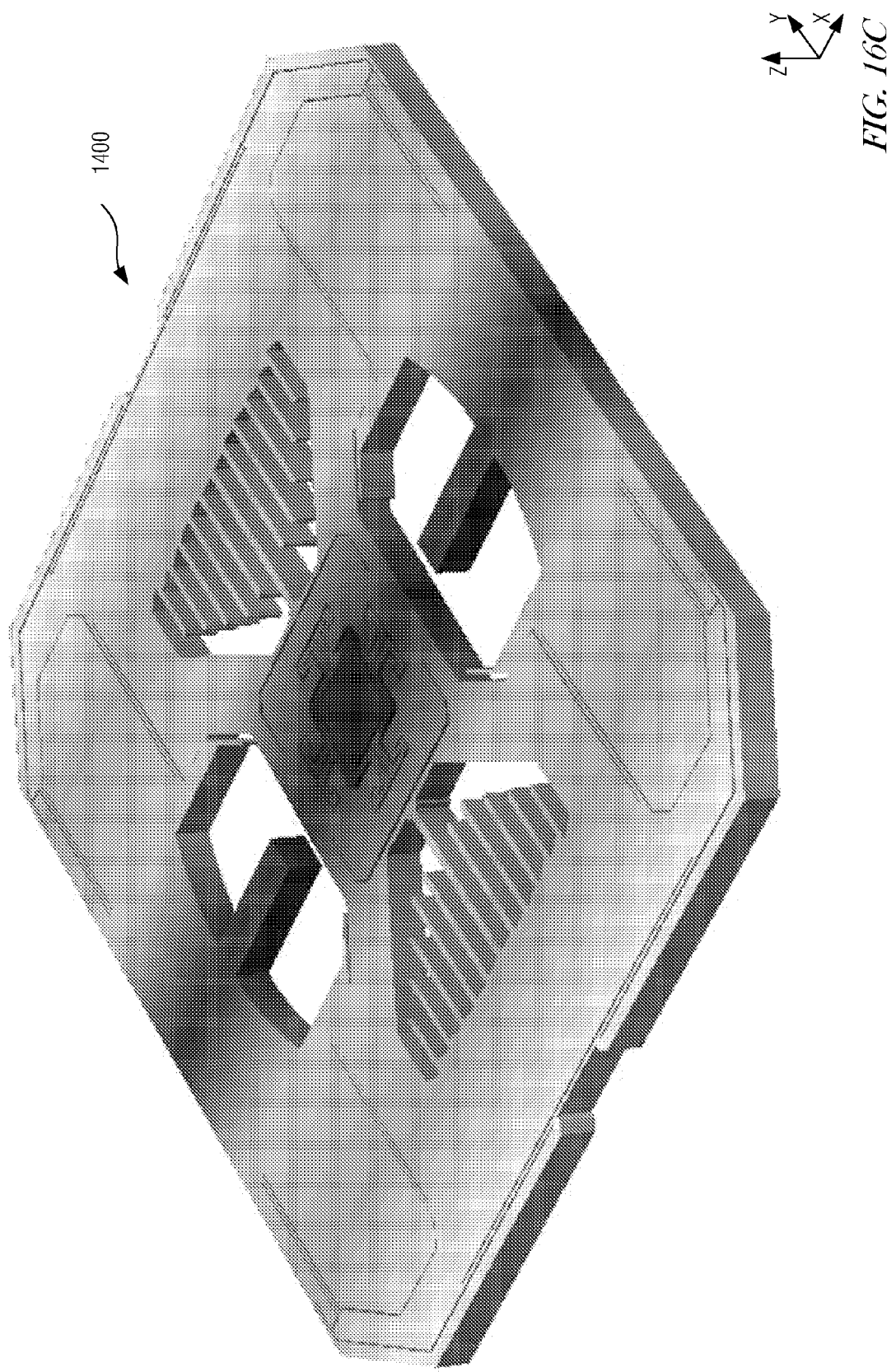
FIG. 16C illustrates the suspension of FIG. 14 flexed about the x-axis, according to an example.
Figure 16D:
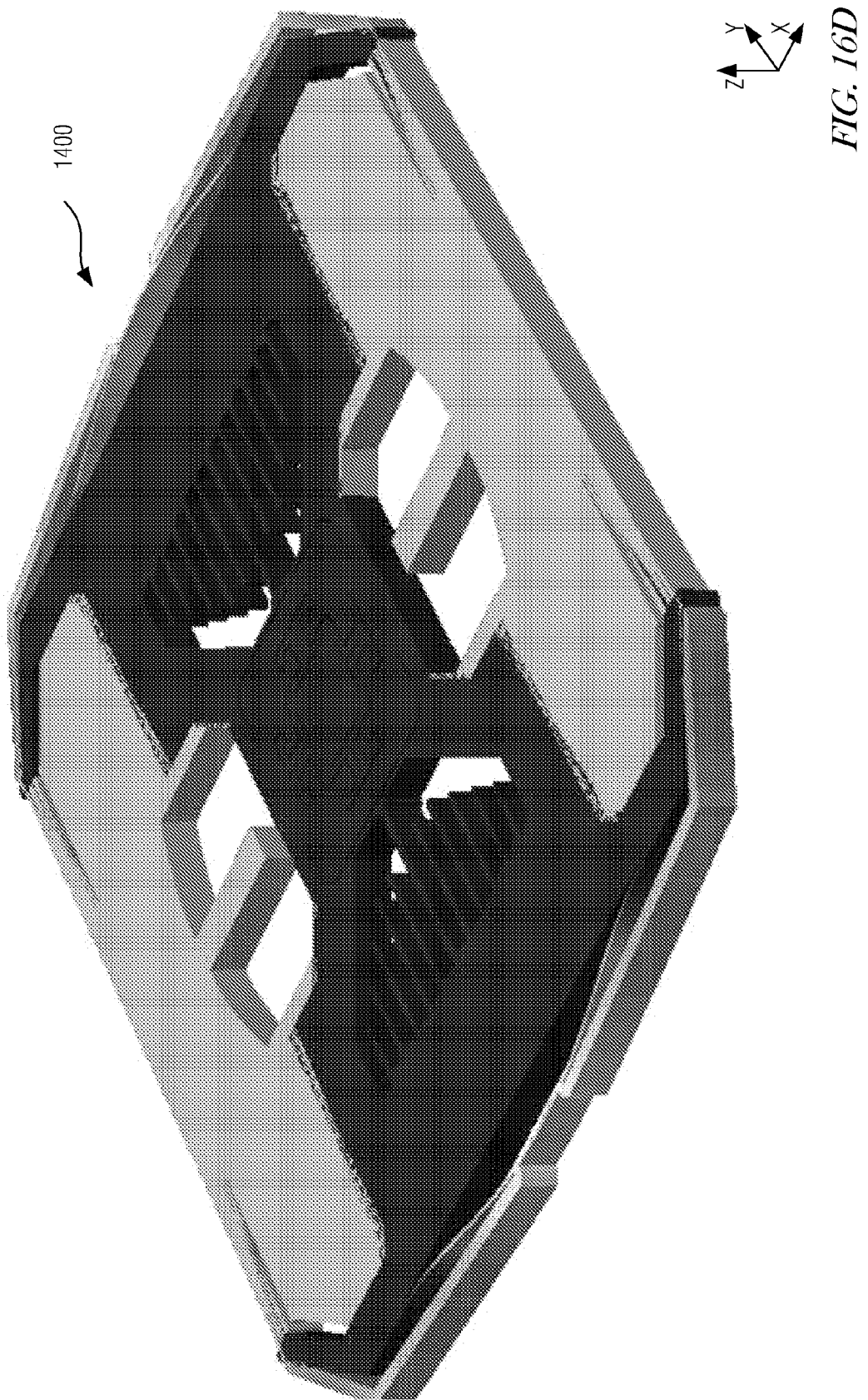
FIG. 16D illustrates the suspension of FIG. 14 flexed in displacement along a y-axis, according to an example.

FIG. 15 illustrates the suspension of FIG. 14 flexed in torsion around a z-axis, according to an example. FIG. 16A illustrates the suspension of FIG. 14 flexed in torsion around a z-axis, according to an example. FIG. 16B illustrates the suspension of FIG. 14 flexed about a y-axis, according to an example. FIG. 16C illustrates the suspension of FIG. 14 flexed about the x-axis, according to an example. FIG. 16D illustrates the suspension of FIG. 14 flexed in displacement along a y-axis, according to an example.

Figure 17:
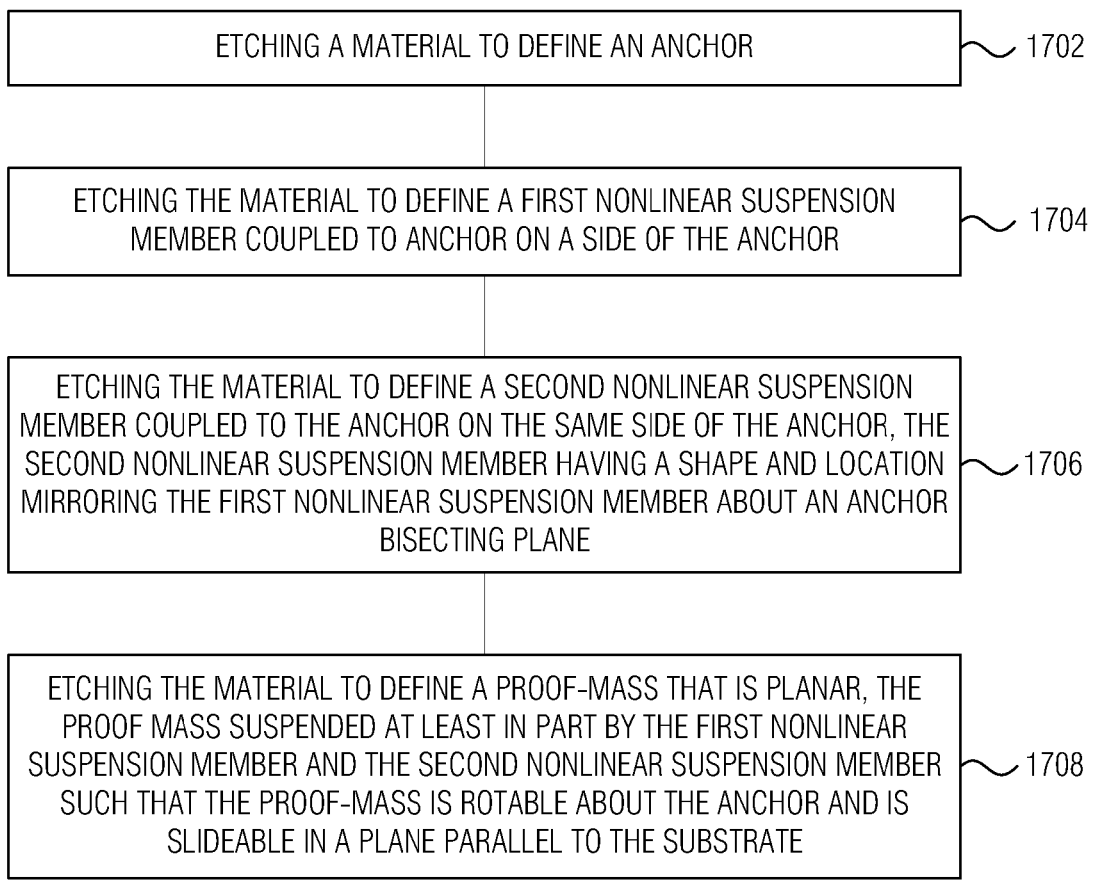
FIG. 17 shows a method of making a low-quadrature-error suspension, according to an embodiment.

FIG. 17 shows a method of making a low-quadrature-error suspension, according to an embodiment. At 1702 the method includes etching a material to define an anchor. At 1704, the method includes etching the material to define a first nonlinear suspension member coupled to anchor on a side of the anchor. At 1706, the method includes etching the material to define a second nonlinear suspension member coupled to the anchor on the same side of the anchor, the second nonlinear suspension member having a shape and location mirroring the first nonlinear suspension member about an anchor bisecting plane. At 1708 the method includes etching the material to define a proof-mass that is planar, the proof mass suspended at least in part by the first nonlinear suspension member and the second nonlinear suspension member such that the proof-mass is rotable about the anchor and is slideable in a plane parallel to the substrate.

Optional methods are possible, including methods in which etching includes deep reactive-ion etching. In some optional methods, the first nonlinear suspension member and the second nonlinear suspension member are part of a first set, comprising etching the material to define a second set of nonlinear suspension members opposite the first set. Some optional methods include etching a third set of nonlinear suspension members for coupling the anchor to the proof-mass and etching a fourth set of nonlinear suspension members for coupling the anchor to the proof-mass, wherein the third set and the fourth set have a similar for factor to the first set and the second set and are bisected by a second anchor bisecting plane perpendicular the first.

ADDITIONAL NOTES

The subject matter of the present document can be described using several examples. Example 1 includes a microelectromechanical die for sensing motion, that includes a fixed portion, an anchor coupled to the fixed portion, a first nonlinear suspension member coupled to anchor on a side of the anchor, a second nonlinear suspension member coupled to the anchor on the same side of the anchor, the second nonlinear suspension member having a shape and location mirroring the first nonlinear suspension member about an anchor bisecting plane and a proof-mass that is planar, the proof mass suspended at least in part by the first nonlinear suspension member and the second nonlinear suspension member such that the proof-mass is rotable about the anchor and is slideable in a plane parallel to the fixed portion.

Example 2 includes the subject matter of example 1, wherein the first nonlinear suspension member has a C-shape.

Example 3 includes the subject matter of example 2, wherein the C-shape includes a inner portion coupled to the anchor and extending toward the anchor bisecting plane, a center portion having a proximal portion and a distal portion, with a proximal portion coupled to the inner portion and a distal portion extending away from the anchor along the anchor bisecting plane and coupled to a outer portion extending away from the anchor bisecting plane.

Example 4 includes the subject matter of example 3, wherein the outer portion of the first nonlinear suspension member has a proximal portion coupled to the center portion of the first nonlinear suspension member, and a distal portion extending away from the anchor bisecting plane, with a fourth portion of the first nonlinear suspension member coupled to the distal portion of the outer portion at a proximal portion of the fourth portion, and extending toward the anchor to a distal portion of the fourth portion that is coupled to a fifth portion of the first nonlinear suspension member that extends toward the anchor bisecting plane.

Example 5 includes the subject matter of any of examples 3-4, wherein the inner portion and the outer portion are linear and parallel.

Example 6 includes the subject matter of example 5, wherein the center portion is perpendicular the inner portion and the outer portion.

Example 7 includes the subject matter of any of examples 3-6, wherein the center portion is parallel the anchor bisecting plane.

Example 8 includes the subject matter of any of examples 1-7, wherein the anchor, the first nonlinear suspension member, the second nonlinear suspension member and the proof-mass are formed of a monolithic material.

Example 9 includes the subject matter of example 8, wherein the fixed portion comprises a fixed monolithic material other than the monolithic material of the anchor, the first nonlinear suspension member, the second nonlinear suspension member and the proof-mass.

Example 10 includes the subject matter of any of examples 1-9, wherein the fixed portion comprises a fixed monolithic material the same as the monolithic material of the anchor, the first nonlinear suspension member, the second nonlinear suspension member and the proof-mass.

Example 11 includes the subject matter of any of examples 1-10, wherein the die is wafer shaped, with each of the first nonlinear suspension member and the second nonlinear suspension member have a substantially rectangular cross-section with the height of the cross-section smaller than the width.

Example 12 includes a that includes etching a material to define an anchor, etching the material to define a first nonlinear suspension member coupled to anchor on a side of the anchor, etching the material to define a second nonlinear suspension member coupled to the anchor on the same side of the anchor, the second nonlinear suspension member having a shape and location mirroring the first nonlinear suspension member about an anchor bisecting plane and etching the material to define a proof-mass that is planar, the proof mass suspended at least in part by the first nonlinear suspension member and the second nonlinear suspension member such that the proof-mass is rotable about the anchor and is slideable in a plane parallel to the substrate.

Example 13 includes the subject matter of example 12, wherein etching includes deep reactive-ion etching.

Example 14 includes the subject matter of any of examples 12-13, wherein the first nonlinear suspension member and the second nonlinear suspension member are part of a first set, comprising etching the material to define a second set of nonlinear suspension members opposite the first set.

Example 15 includes the subject matter of example 14, comprising etching a third set of nonlinear suspension members for coupling the anchor to the proof-mass and etching a fourth set of nonlinear suspension members for coupling the anchor to the proof-mass, wherein the third set and the fourth set have a similar for factor to the first set and the second set and are bisected by a second anchor bisecting plane perpendicular the first.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. The above description is intended to be illustrative, and not restrictive. In other examples, the above-described examples (or one or more aspects thereof) may be used in combination with each other. Other embodiments can be used, such as by one of ordinary skill in the art upon reviewing the above description.

The Abstract is provided to comply with 37 C.F.R. §1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A microelectromechanical die for sensing motion, comprising:
    a fixed portion;
    an anchor coupled to the fixed portion;
    a first nonlinear suspension member coupled to the anchor on a side of the anchor;
    a second nonlinear suspension member coupled to the anchor on the same side of the anchor, the second nonlinear suspension member having a shape and location mirroring the first nonlinear suspension member about an anchor bisecting plane; and
    a proof-mass that is planar, the proof mass suspended at least in part by the first nonlinear suspension member and the second nonlinear suspension member such that the proof-mass is rotable about the anchor and is slideable in a plane parallel to the fixed portion.

2. The die of claim 1, wherein the first nonlinear suspension member has a C-shape.

3. The die of claim 2, wherein the C-shape includes a inner portion coupled to the anchor and extending toward the anchor bisecting plane, a center portion having a proximal portion and a distal portion, with a proximal portion coupled to the inner portion and a distal portion extending away from the anchor along the anchor bisecting plane and coupled to an outer portion extending away from the anchor bisecting plane.

4. The die of claim 3, wherein the outer portion of the first nonlinear suspension member has a proximal portion coupled to the center portion of the first nonlinear suspension member, and a distal portion extending away from the anchor bisecting plane, with a fourth portion of the first nonlinear suspension member coupled to the distal portion of the outer portion at a proximal portion of the fourth portion, and extending toward the anchor to a distal portion of the fourth portion that is coupled to a fifth portion of the first nonlinear suspension member that extends toward the anchor bisecting plane.

5. The die of claim 3, wherein the inner portion and the outer portion are linear and parallel.

6. The die of claim 5, wherein the center portion is perpendicular to the inner portion and the outer portion.

7. The die of claim 3, wherein the center portion is parallel to the anchor bisecting plane.

8. The die of claim 3, wherein the anchor, the first nonlinear suspension member, the second nonlinear suspension member and the proof-mass are formed of a monolithic material.

9. The die of claim 8, wherein the fixed portion comprises a fixed monolithic material other than the monolithic material of the anchor, the first nonlinear suspension member, the second nonlinear suspension member and the proof-mass.

10. The die of claim 9, wherein the fixed portion comprises a fixed monolithic material that is the same as the monolithic material of the anchor, the first nonlinear suspension member, the second nonlinear suspension member, and the proof-mass.

11. A method for sensing motion with a microelectromechanical die, comprising:
    rotating a proof mass with respect to an anchor that is coupled to a substrate by:

deforming a first nonlinear suspension member, that couples the proof-mass to a first side of the anchor, out-of-plane of the plane of the proof-mass, above the proof-mass; and deforming a second nonlinear suspension member, that couples the proof-mass to the first side of the anchor, out-of-plane of the plane of the proof-mass on an opposite first side of the plane of the proof-mass, below the proof-mass.

12. The method of claim 11, wherein the deforming the second nonlinear suspension member provides an out-of-plane motion below the proof-mass that cancels out an out-of-plane motion above the proof-mass.

13. The method of claim 11, wherein, deforming a third nonlinear suspension member, that couples the proof-mass to a second side of the anchor, out-of-plane of the plane of the proof-mass; and deforming a fourth nonlinear suspension member, that couples the proof-mass to the second side of the anchor, out-of-plane of the plane of the proof-mass on an opposite second side of the plane of the proof-mass.

14. The method of claim 13, wherein, the second side of the anchor is opposite the first side of the anchor, wherein deforming the third nonlinear suspension member includes deforming the third nonlinear suspension member below the plane of the proof-mass, and wherein deforming the fourth nonlinear suspension member includes deforming the fourth nonlinear suspension member above the plane of the proof-mass.

15. The method of claim 14, wherein the plane bisects the anchor vertically and passes between the first and second nonlinear suspension members and between the third and fourth nonlinear suspension members.

* * * * *